United States Patent
Yamaguchi et al.

(10) Patent No.: US 7,262,404 B2
(45) Date of Patent: Aug. 28, 2007

(54) PHOTODETECTOR MANUFACTURABLE BY SEMICONDUCTOR PROCESSES

(75) Inventors: Takumi Yamaguchi, Kyoto (JP); Shigetaka Kasuga, Hirakata (JP); Takahiko Murata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 210 days.

(21) Appl. No.: 10/990,679

(22) Filed: Nov. 18, 2004

(65) Prior Publication Data
US 2005/0103983 A1 May 19, 2005

(30) Foreign Application Priority Data
Nov. 18, 2003 (JP) .............................. 2003-388429

(51) Int. Cl.
H01L 31/00 (2006.01)
H01L 31/0232 (2006.01)
(52) U.S. Cl. ..................... 250/226; 257/294
(58) Field of Classification Search ................ 438/57, 438/35; 257/294; 250/208.1, 214.1
See application file for complete search history.

(56) References Cited

U.S. PATENT DOCUMENTS 5,182,624 A * 1/1993 Tran ............................ 257/40
5,354,989 A * 10/1994 Fenner ...................... 250/336.2
5,534,443 A 7/1996 Ohtagaki et al.
5,766,980 A 6/1998 Ohtagaki et al.
6,482,669 B1 * 11/2002 Fan ............................... 438/70

FOREIGN PATENT DOCUMENTS

JP 5-6986 1/1993

* cited by examiner

Primary Examiner—Georgia Epps
Assistant Examiner—Tony Ko
(74) Attorney, Agent, or Firm—McDermott Will & Emery LLP

(57) ABSTRACT

A photodetector includes a semiconductor substrate having photo-cells (1a, 1b, 1c). Each photo-cell is provided with a filter layer 20 that transmits light in a wavelength range predetermined for the photo-cell, and a photoelectric converter 17 that generates a signal charge according to an intensity of the light transmitted through the filter layer 20. Thickness (ta, tb, tc) of the filter layers 20 are corresponding to the wavelength ranges predetermined for respective photo-cells. By such a structure, it is possible to provide cost effective photodetectors that can be manufactured without managing materials for pigments and dyestuff for different colors when making color filters.

12 Claims, 13 Drawing Sheets

FIG.5A $$\begin{bmatrix} Sc \\ Sb \\ Sa \end{bmatrix} = \begin{bmatrix} W_{11} & W_{12} & W_{13} \\ 0 & W_{22} & W_{23} \\ 0 & 0 & W_{33} \end{bmatrix} \begin{bmatrix} B \\ G \\ R \end{bmatrix}$$

FIG.5B $$\begin{bmatrix} B \\ G \\ R \end{bmatrix} = \begin{bmatrix} \dfrac{1}{W_{11}} & -\dfrac{W_{12}}{W_{11}W_{12}} & \dfrac{W_{12}W_{23}-W_{13}W_{22}}{W_{11}W_{22}W_{33}} \\ 0 & \dfrac{1}{W_{22}} & -\dfrac{W_{23}}{W_{22}W_{33}} \\ 0 & 0 & \dfrac{1}{W_{33}} \end{bmatrix} \begin{bmatrix} Sc \\ Sb \\ Sa \end{bmatrix}$$

AFTER CVD STEP

AFTER PHOTORESIST COATING STEP

AFTER EXPOSURE/ DEVELOPMENT STEP

AFTER DRY ETCHING STEP

AFTER PHOTORESIST COATING STEP

AFTER EXPOSURE/ DEVELOPMENT STEP

AFTER DRY ETCHING STEP

AFTER PHOTORESIST REMOVING STEP

PHOTODETECTOR MANUFACTURABLE BY SEMICONDUCTOR PROCESSES

BACKGROUND OF THE INVENTION (1) Field of the Invention

The present invention relates to photodetectors such as image sensors, and more specifically to color filters provided to photo-cells in a photodetector.

(2) Description of the Related Art

A commonly used photodetector includes a semiconductor substrate having a plurality of photo-cells, and each photo-cell is provided with a color filter and a photodiode. There are red color filters (R), green color filters (G), and blue color filters (B) in one photodetector, and each photo-cell is assigned with a color filter having one of the three colors. The photodiodes generate signal charges responsive to the intensity of the light that has passed through the color filters. Consequently, a signal charge for light of a specific color in the incident light is generated in each photo-cell. Imaging data for one picture is generated by collecting the signal charges for the three colors generated in the photo-cells (See Japanese Laid-Open Patent Application No. H05-006986, for example).

Conventional color filters are usually manufactured by mixing acrylic resin with pigments or dyestuff of respective colors (See Japanese Laid-Open Patent Application No. H07-311310, for example).

Manufacturing the conventional color filters, however, requires a troublesome material management for the pigments or dyestuff of different colors in the manufacturing process, and this hinders the cost reduction of the photodetectors.

SUMMARY OF THE INVENTION

In view of the above problem, the present invention aims to provide cost effective photodetectors that do not require a material management for the pigments or dyestuff in the manufacturing process.

In order to achieve the above object, a photodetector according to the present invention is a photodetector comprising a semiconductor substrate having a plurality of photo-cells, each photo-cell including: a filter layer that transmits light in a wavelength range predetermined for the photo-cell; and a photoelectric converter operable to generate a signal charge according to an intensity of the transmitted light, wherein a thickness of each filter layer corresponds to a wavelength range predetermined for each photo-cell.

With the above structure, the wavelength range of the light transmitted through the filter layers is determined based on the thickness of each filter layer corresponding to a predetermined color. Therefore, the material management for the pigments or dyestuff for different colors is not necessary in the manufacturing process and thus the production cost can be reduced.

The above photodetector may also be such a photodetector wherein the filter layer is made of a material whose transmittance of light having a wavelength shorter than a cutoff wavelength is lower than that of light having a wavelength equal to or longer than the cutoff wavelength, the cutoff wavelength being determined by a thickness of the material.

With the above structure, it is possible to have the filter layers function as filters that mainly transmit the light having a wavelength longer than the cutoff wavelength.

The above photodetector may also be such a photodetector wherein the filter layer is made of a material whose transmittance is lowered by absorbing light.

In order to reduce the light transmission, there are two possible methods. One is to have the filter layer absorb light, and the other is to have the filter layer reflect light. In the latter method, light reflected by the filter layer could scatter in the photodetector, and therefore an incidence of flare phenomenon is higher than the case of the former method. Flare is such a phenomenon that a correct signal is overlapped with an incorrect signal by light reflected from neighboring photo-cells. With the present invention, the incidence of flare phenomenon is decreased by employing the former method.

The above photodetector may also be such a photodetector wherein the filter layer is mainly composed of one of polysilicon, amorphous silicon, and silicon.

With the above structure, the filter layers can be manufactured using a semiconductor fabrication technology. For example, the polysilicon layers are formed over the photo-cells using CVD, and then dry-etching is performed so that each layer has a thickness predetermined for each photo-cell.

Therefore, a color filter manufacturing process that manages acrylic resins is not necessary. As a result, it is possible to utilize manufacturing facilities for semiconductor fabrication as well as to simplify the manufacturing process.

The above photodetector may also be such a photodetector wherein the substrate is made of silicon, the photoelectric converter is formed by doping the substrate with an N-type impurity, and the filter layer is formed by doping the photoelectric converter with a P-type impurity.

With the above structure, the filter layers can be manufactured using a semiconductor fabrication technology. For example, it is possible to make a filter layer to have a desired thickness by adjusting acceleration energy of the P-type impurity for each photo-cell.

Therefore, a color filter manufacturing process that manages acrylic resins is not necessary. As a result, it is possible to utilize manufacturing facilities for semiconductor fabrication as well as to simplify the manufacturing process.

The above photodetector may also be such a photodetector wherein the filter layer is made of a material whose cutoff wavelength becomes longer as the material becomes thicker.

With the above structure, it is possible to adjust the light to be transmitted to be in a desired wavelength range by determining the thickness.

The above photodetector may also be such a photodetector wherein the thickness of each filter layer is one of a first thickness, a second thickness, and a third thickness, a cutoff wavelength for the first thickness is between a red wavelength range and a green wavelength range, a cutoff wavelength for the second thickness is between the green wavelength range and a blue wavelength range, and a cutoff wavelength for the third thickness is between the blue wavelength range and an ultra-violet wavelength range.

According to the above structure, each filter layer provided to each photo-cell may transmit light in one of the following wavelength range, according to the thickness of the filter layer.

First Thickness: Red Wavelength Range
Second Thickness: Red and Green Wavelength Ranges
Third Thickness: Red, Green, and Blue Wavelength Ranges Specifically, a signal charge corresponding to light in the red wavelength range is generated in a first photo-cell that is provided with a filter layer having the first thickness. Similarly, a signal charge corresponding to light in the red and green wavelength ranges is generated in a second photo-cell that is provided with a filter layer having the second thickness, and a signal charge corresponding to light in the red, green, and blue wavelength ranges is generated in a third photo-cell that is provided with a filter layer having the third thickness.

Thus, a red color signal is obtained from the signal charge generated in the first photo-cell. Further, a green color signal is obtained from a difference between the signal charges generated in the first and the second photo-cells. Also, a blue color signal is obtained from a difference between the signal charges generated in the second and the third photo-cells.

The above photodetector may also be such a photodetector wherein the photo-cell further includes an antireflection layer made of a material whose refractive index is smaller than that of the filter layer, the antireflection layer being disposed on a main surface of the filter layer facing toward a light source.

With the above structure, the antireflection layer is disposed between the filter layer and a gas, and the reflection rate of the incident light can be reduced. Therefore, it is possible to improve the sensitivity of the photodetector.

The above photodetector may also be such a photodetector wherein the filter layer is mainly composed of one of polysilicon, amorphous silicon, and silicon, and the antireflection layer is composed of one of silicon nitride, silicon oxide, and silicon oxynitride.

With the above structure, the filter layers and antireflection layers can be manufactured using a semiconductor fabrication technology. Therefore, it is possible to utilize manufacturing facilities for semiconductor fabrication as well as to simplify the manufacturing process.

The above photodetector may also be such a photodetector wherein the photo-cell further includes a photo-shield forming layer having a photo-shield and an aperture at a part corresponding to the photoelectric converter, the photo-shield blocking light other than light passing through the aperture, and the filter layer is positioned between the photo-shield forming layer and the photoelectric converter.

With the above structure, it is possible to prevent light scattered in adjacent photo-cells from coming in to the photoelectric converter. Thus, in each photo-cell, a noise caused by the scattered light from the adjacent photo-cells-is be reduced.

The above photodetector may also be such a photodetector wherein the photo-cell further includes a silicon oxide layer whose thickness is in a range of 1 nm to 150 nm, disposed between the filter layer and the photoelectric converter.

With the above structure, it is possible to insulate the filter layer and the photoelectric converter. By this, it is possible to prevent the signal charge of the photoelectric converter from leaking to the filter layer.

In general, incident light reflects at a boundary between the silicon oxide layer and the photoelectric converter at a certain rate. However, it is known that the reflection rate can be reduced by setting the thickness of the silicon oxide layer in a range of 1 nm to 150 nm. Therefore, it is possible to suppress the decrease in sensitivity of photo-cells by inserting the silicon oxide layer.

The above photodetector may also be such a photodetector wherein the photo-cell further comprises: a gate electrode operable to, when the signal charge is not transferred, generate a gate potential at a gate region between the photoelectric converter and a transfer destination, the gate potential being lower than a potential at the photoelectric converter; and a potential barrier, at which a barrier potential that is lower than the gate potential is generated, disposed between the filter layer and the photoelectric converter.

With the above structure, the potentials at the gate region, the photoelectric converter, and the potential barrier in the time of non-transfer are low, high, and low, respectively. By this, electrons generated in the photoelectric converter are accumulated in the photoelectric converter that has a higher potential. Also by this structure, it is possible to prevent the accumulated electrons from leaking to the filter layer over the potential barrier.

Further, in order to achieve the above object, a photodetector according to the present invention is a photodetector comprising a semiconductor substrate having a plurality of photo-cells, each photo-cell including: a photoelectric converter operable to generate a signal charge according to intensity of light, whereinsome of the photo-cells are each provided with a filter layer at a position through which the light to the photoelectric converter passes, a thickness of each filter layer corresponding to a wavelength range predetermined for each photo-cell, and the remaining photo-cells are not provided with a filter layer.

With the above structure, similarly to the previously described photodetector, the material management of pigments or dyestuff for different colors is not necessary in the manufacturing process and thus the production cost can be reduced.

The above photodetector may also be such a photodetector wherein the filter layer is made of a material whose transmittance of light having a wavelength shorter than a cutoff wavelength is lower than that of light having a wavelength equal to or longer than the cutoff wavelength, the cutoff wavelength being determined by a thickness of the material.

With the above structure, it is possible to have the filter layers function as filters that mainly transmits the light having a wavelength longer than the cutoff wavelength.

The above photodetector may also be such a photodetector wherein the thickness of each filter layer is one of a first thickness and a second thickness, a cutoff wavelength for the first thickness is between a red wavelength range and a green wavelength range, and a cutoff wavelength for the second thickness is between the green wavelength range and a blue wavelength range.

Such a structure can be applied in a case in which the photodetector receives light from which ultraviolet ray is already removed. Generally, incident light collected by a lens in a common camera system reaches the photodetector after passing through an optical lowpass filter and an infrared cut filter. In such a camera system, if an ultraviolet cut filter is also provided, the ultraviolet cut filter serves as a filter that transmits light in a wavelength range of a wavelength longer than a boundary between the blue wavelength range and a ultra-violet wavelength range. Therefore, a filter layer is not necessary at the photo-cell that generates the signal charge based on the light in this wavelength range.

Thus, it is possible to shorten the manufacturing process of the filter layers, because forming the filter layers just for two colors is sufficient for the photodetector, instead of the filter layers for three colors.

A signal processing apparatus according to the present invention is a signal processing apparatus for obtaining a color signal based on a first source signal and a second source signal, the first source signal corresponding to intensity of light in a first wavelength range, the second source signal corresponding to intensity of light in a second wavelength range including the first wavelength range, and the color signal corresponding to intensity of light in the second wavelength range excluding the first wavelength range, the signal processing apparatus comprising: a holding unit that holds weight coefficients corresponding to the first source signal and the second source signal, respectively; and a calculation unit operable to obtain the color signal, by multiplying the first source signal and the second source signal respectively by the weighting factors, and deriving a difference between the results of the multiplication.

With the above structure, the signal processing apparatus can obtain the color signal corresponding to the intensity of the light in the second wavelength range excluding the first wavelength range. The above signal processing apparatus is employed when the photodetector is to output the first source signal and the second source signal as described above.

A signal processing apparatus according to the present invention is a signal processing apparatus for obtaining a red color signal corresponding to intensity of light in a red wavelength range, a green color signal corresponding to intensity of light in a green wavelength range, and a blue color signal corresponding to intensity of light in a blue wavelength range, based on a first source signal, a second source signal, and a third source signal, the first source signal corresponding to intensity of light in a wavelength range longer than a wavelength between the red wavelength range and the green wavelength range, the second source signal corresponding to intensity of light in a wavelength range longer than a wavelength between the green wavelength range and the blue wavelength range, and the third source signal corresponding to intensity of light in a wavelength range longer than a wavelength between the blue wavelength range and a ultra-violet wavelength range, the signal processing apparatus comprising: a holding unit that holds a conversion matrix for converting a set of the first source signal, the second source signal and the third source signal into a set of the red color signal, the green color signal and the blue color signal; and a calculation unit operable to apply the conversion matrix to the set of the first source signal, the second source signal and the third source signal.

Each source signal correspond to the intensity of the following wavelength ranges.
First Source Signal: Red Wavelength Range
Second Source Signal: Red and Green Wavelength Ranges
Third Source Signal: Red, Green, and Blue Wavelength Ranges According to the above structure, the signal processing apparatus may obtain the set of the red color signal, the green color signal and the blue color signal from the set of the first source signal, the second source signal and the third source signal, as follows.

| | |
|---|---|
| Red Signal: | Red Wavelength Range |
| Green Signal: | Green Wavelength Range |
| Blue Thickness: | Blue Wavelength Range |

A method of manufacturing a photodetector according to the present invention is a method of manufacturing a photodetector including a semiconductor substrate having a plurality of photo-cells, each photo-cell being provided with a filter layer that transmits light in a wavelength range predetermined for the photo-cell, and a photoelectric converter operable to generate a signal charge according to an intensity of the transmitted light, the method comprising: forming the photoelectric converter on each photo-cell; forming a layer of a same thickness over each photoelectric converter, the layer being made of a material of which a wavelength range of light to be transmitted is determined based on a thickness; and etching the layer so that a resulting layer has a thickness predetermined for each photo-cell.

With the above structure, the wavelength range of the light transmitted through the filter layers is determined based on the thickness of each layer corresponding to a predetermined color. Therefore, the material management of pigments or dyestuff for different colors is not necessary in the manufacturing process and thus the production cost can be reduced.

Further, the filter layers can be manufactured using a semiconductor fabrication technology, if either polysilicon and amorphous silicon is selected as the material for the filter layer. Therefore, a color filter manufacturing process that manages acrylic resins is not necessary. As a result, it is possible to utilize manufacturing facilities for semiconductor fabrication as well as to simplify the manufacturing process.

A method of manufacturing a photodetector according to the present invention is a method of manufacturing a photodetector including a semiconductor substrate having a plurality of photo-cells, each photo-cell being provided with a filter layer that transmits light in a wavelength range predetermined for the photo-cell, and a photoelectric converter operable to generate a signal charge according to an intensity of the transmitted light, the method comprising: forming the photoelectric converter by doping each photo-cell with an N-type impurity; and doping the photoelectric converters with a P-type impurity so that the doped part have a thickness predetermined for each photo-cell.

With the above structure, the wavelength range of the light transmitted through the filter layers is determined based on the thickness of each layer corresponding to a predetermined color. Therefore, the material management of pigments or dyestuff for different colors is not necessary in the manufacturing process and thus the production cost can be reduced.

Further, the filter layers can be manufactured using a semiconductor fabrication technology. Therefore, a color filter manufacturing process that manages acrylic resins is not necessary. As a result, it is possible to utilize manufacturing facilities for semiconductor fabrication as well as to simplify the manufacturing process.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIGS. 5A and 5B show a matrix and an inverse matrix held in a matrix holding unit 61;

DESCRIPTION OF THE PREFERRED EMBODIMENTS

First Embodiment

[outline]

In a first embodiment, filter layers in all pixel cells are made only of polysilicon. As a characteristic of polysilicon, a wavelength range of light to be transmitted through a polysilicon layer varies according to the thickness of the layer. Therefore, it is possible to use the polysilicon filter layers as color filters by setting a thickness of polysilicon for each photo-cell is different from cell to cell.

Because the wavelength range of light to be transmitted through a polysilicon filter layer is determined based on the thickness of the corresponding filter layer, instead of pigments or dyestuff for each color, it is not necessary to control material for the pigments or dyestuff of different colors in manufacturing the filter layers. Therefore, the production cost can be reduced.

In addition, the filter layers can be manufactured using a semiconductor fabrication technology, and a color filter manufacturing process that manages acrylic resins is not necessary. As a result, it is possible to utilize manufacturing facilities for semiconductor fabrication as well as to simplify the manufacturing process.

[Structure]

Figure 1:
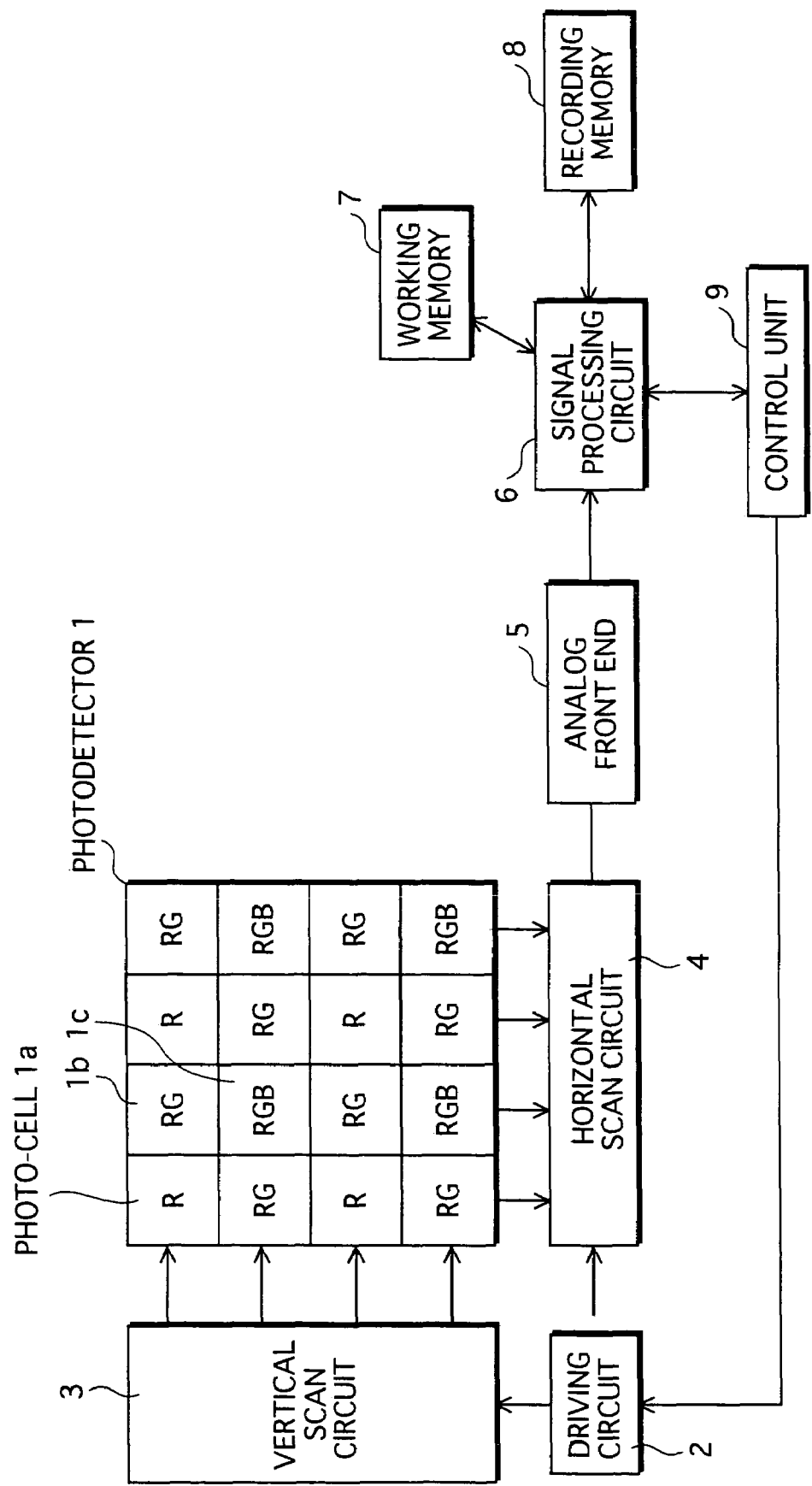
FIG. 1 illustrates a structure of a camera system according to the present invention.

FIG. 1 illustrates a structure of a camera system according to the present invention.

The camera system includes a photodetector 1, a driving circuit 2, a vertical scan circuit 3, a horizontal scan circuit 4, an analog front end 5, a signal processing circuit 6, a working memory 7, a recording memory 8, and a control unit 9.

The photodetector 1 is a so called MOS image sensor, and is constituted by photo-cells (1a, 1b, 1c) that are formed on a semiconductor substrate. A signal charge is generated in each photo-cell according to the intensity of light in a wavelength range predetermined for the corresponding photo-cell. The photo-cells in FIG. 1 designate R, RG, and RGB, respectively. "R" indicates that the cell is provided with a color filter that transmits light in a red wavelength range, "RG" indicates that the cell is provided with a color filter that transmits light in the red wavelength range and a green wavelength range, and "RGB" indicates that the cell is provided with a color filter that transmits light in the red wavelength range, the green wavelength range, and a blue wavelength range. Specifically, a signal charge corresponding to light in the red wavelength range is generated in the photo-cell 1a. Similarly, a signal charge corresponding to light in the red and green wavelength ranges is generated in the photo-cell 1b, and a signal charge corresponding to light in the red, green, and blue wavelength ranges is generated in the photo-cell 1c. Also, as shown in FIG. 1, the color filters are arranged substantially based on the Bayer pattern. In the case in which the Bayer pattern is employed, the color filters for three different colors are assigned to four pixel cells. However, the arrangement of the color filters does not restricted to the Bayer pattern, and it is also possible to assign color filters for four different colors to four pixel cells, respectively.

In the present specification, the blue wavelength range is defined to be shorter than 490 nm and no shorter than 400 nm, the green wavelength range is defined to be shorter than 580 nm and no shorter than 490 nm, and the red wavelength range is defined to be shorter than 700 nm and no shorter than 580 nm. Further, a wavelength range shorter than 400 nm is defined as an ultraviolet wavelength range, and a wavelength range of 700 nm and longer is defined as an infrared wavelength range.

The driving circuit 2 drives the vertical scan circuit 3 and the horizontal scan circuit 4 based on a trigger signal from the control unit 9.

The vertical scan circuit 3 sequentially activates the photo-cells by line, based on a driving signal from the driving circuit 2. The vertical scan circuit 3, then, transfers signal charges in the activated photo-cells for one line all at once, to the horizontal scan circuit 4.

The horizontal scan circuit 4 is operated synchronously with the vertical scan circuit 3, based on the driving signal from the driving circuit 2. The horizontal scan circuit 4 outputs the transferred signal charges for one line to the analog front end 5, sequentially, for each column.

With the driving circuit 2, the vertical scan circuit 3, and the horizontal scan circuit 4, the signal charges in the photo-cells that are disposed in a matrix are converted into signal voltages, and then the signal voltages are outputted to the analog front end 5 in serial.

The analog front end 5 samples and amplifies the signal voltages, converts analog signals into digital signals by performing an A/D conversion, and outputs the digital signals.

The signal processing circuit 6 is a so called digital signal processor (DSP). The signal processing circuit 6 converts the digital signals from the analog front end 5 into a red signal, a green signal, and a blue signal, and generates imaging data.

The working memory 7 is used when the signal processing circuit 6 converts the digital signals corresponding to the photo-cells into the color signals of respective colors. A specific example of the working memory 7 is an SDRAM.

The recording memory 8 records the imaging data generated by the signal processing circuit 6. A specific example of the recording memory 8 is an SDRAM.

The control unit 9 controls the driving circuit 2 and the signal processing circuit 6. For example, the control unit 9 outputs the trigger signal to the driving circuit 2, in response to a user operation of pressing a shutter button.

The following explains, in detail, a structure of the photo-cells (1a, 1b, 1c) in the photodetector 1.

Figure 2:
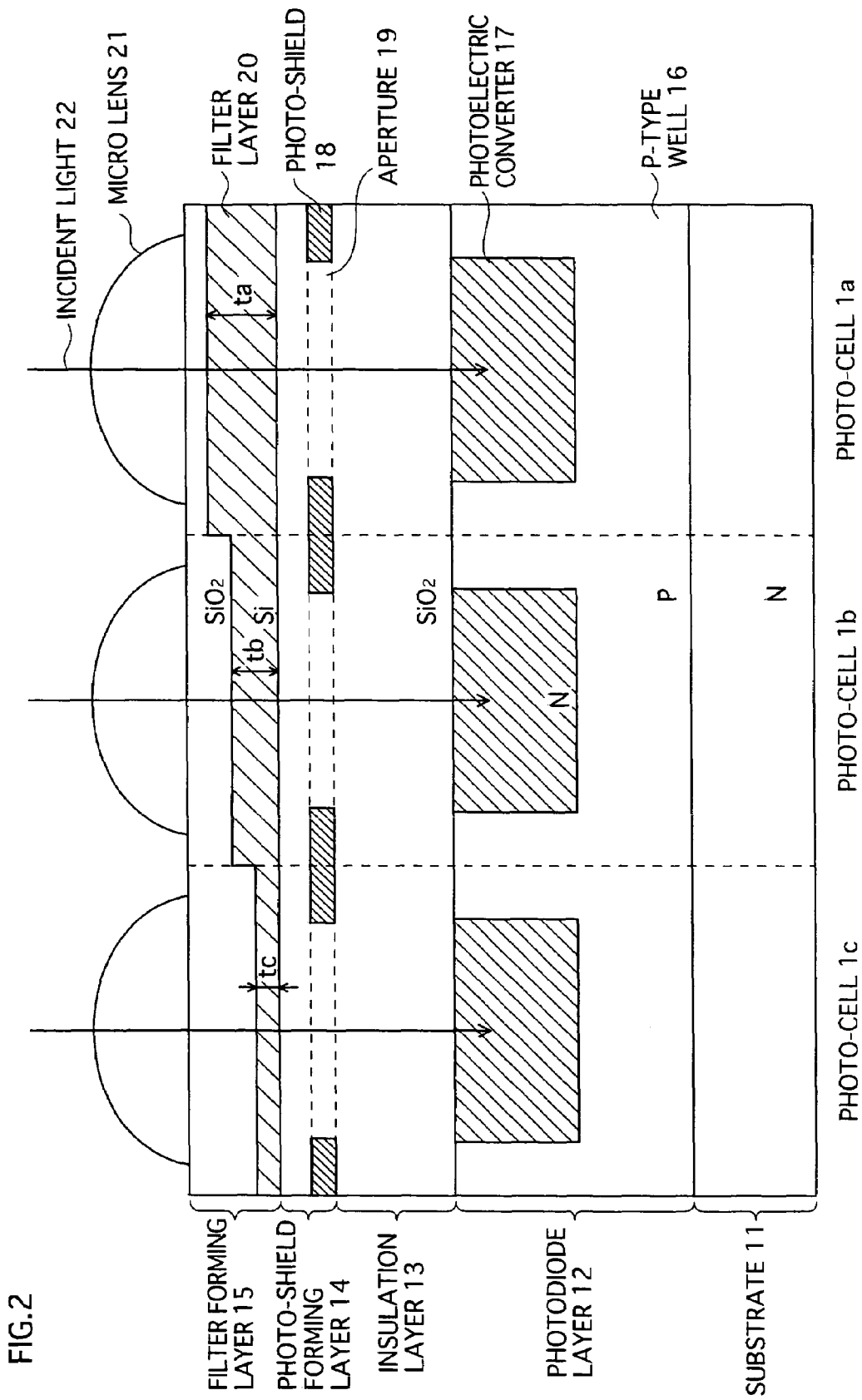
FIG. 2 is a sectional view of photo-cells (1a, 1b, 1c) according to a first embodiment.

FIG. 2 is a sectional view of the photo-cells (1a, 1b, 1c) according to the first embodiment.

Each photo-cell has a structure in which layers are disposed on a silicon substrate 11 to which an N-type impurity is added. The layers disposed on the silicon substrate 11 are as follows.

A photodiode layer 12 includes a P-type well 16 formed by implanting a P-type impurity to the substrate 11, and a photoelectric converter 17 that is an N-type region formed by implanting an N-type impurity to the P-type well 16.

An insulation layer 13 is a silicon oxide layer that is provided for the purpose of insulating the photodiode layer 12 from a photo-shield forming layer 14.

The photo-shield forming layer 14 includes a photo-shield 18 made of metal such as aluminum and tungsten. The photo-shield 18 is formed using metal deposition or spattering after masking a part corresponding to an aperture 19 in the photo-shield forming layer 14. Moreover, the photo-shield forming layer 14 may also include, in addition to the photo-shield 18, wires from the vertical scan circuit 3 and/or to the horizontal scan circuit 4 through which the signal charges are transferred.

A filter forming layer 15 includes a filter layer 20 made of polysilicon.

An incident light 22 that enters from an upper part of the photo-cells is collected by a micro lens 21, and reaches a photoelectric converter 17 through the filter layer 20 and the aperture 19. Note that the incident light 22 in the explanation has already passed through an infrared cut filter (not shown in the drawing) above the photo-cells, and therefore light in the infrared wavelength range has already been cut.

The thicknesses (ta, tb, tc) of the filter layers 20 are determined for the respective photo-cells.

Generally, polysilicon has such a characteristic that its cutoff wavelength is determined according to its thickness, and that a polysilicon layer of a specific thickness transmits light of a cutoff wavelength and longer, and substantially cuts off light of a wavelength shorter than the cutoff wavelength. The cutoff wavelength here refers to a wavelength at which transmittance of light becomes lower than a peak transmittance at a specific ratio. Strictly speaking, polysilicon also transmits a small amount of light having a wavelength shorter than the cutoff wavelength. The amount of such light is vanishingly small, however, and does not contribute much in forming a signal charge. Therefore, in order to simplify explanations, light having a wavelength shorter than a cutoff wavelength is described as being cut off in the present specification.

In a case of polysilicon, when the thickness is greater, then the cutoff wavelength becomes longer. When the thickness of the polysilicon is thinner, then the cutoff wavelength becomes shorter.

Specifically, by adjusting the thickness of the filter layer 20 in each photo-cell, it is possible to set cutoff wavelengths (λa, λb, λc) for the photo-cells (1a, 1b, 1c), at wavelengths between the red and green wavelength ranges, the green and blue wavelength ranges, and the blue and ultraviolet wavelength ranges, respectively.

When the cutoff wavelengths are set this way, the signal charge in the photo-cell 1a is generated based on the light in the red wavelength range, the signal charge in the photo-cell 1b is generated based on the light in the red and green wavelength ranges, and the signal charge in the photo-cell 1c is generated based on the light in the red, green, and blue wavelength ranges.

Specifically, the cutoff wavelengths (λa, λb, λc) of the filter layers 20 in the photo-cells (1a, 1b, 1c) are set as follows.

| | |
|---|---|
| λa: | 580 nm |
| λb: | 490 nm |
| λc: | 400 nm |

The thicknesses ta, tb, and tc of the filter layers 20 corresponding to the listed cutoff wavelengths are as follows.

| | |
|---|---|
| ta: | 0.5 μm |
| tb: | 0.3 μm |
| tc: | 0.1 μm |

Thus, the wavelengths of the light that may be transmitted through the filter layers 20 of the photo-cells are as follows.
Photo-cell 1a:
580 nm or longer (red wavelength range) Photo-cells 1b:
490 nm or longer (red and green wavelength ranges) Photo-cells 1c:
400 nm or longer (red, green, and blue wavelength ranges) The above are shown in FIG. 3.

Figure 3:
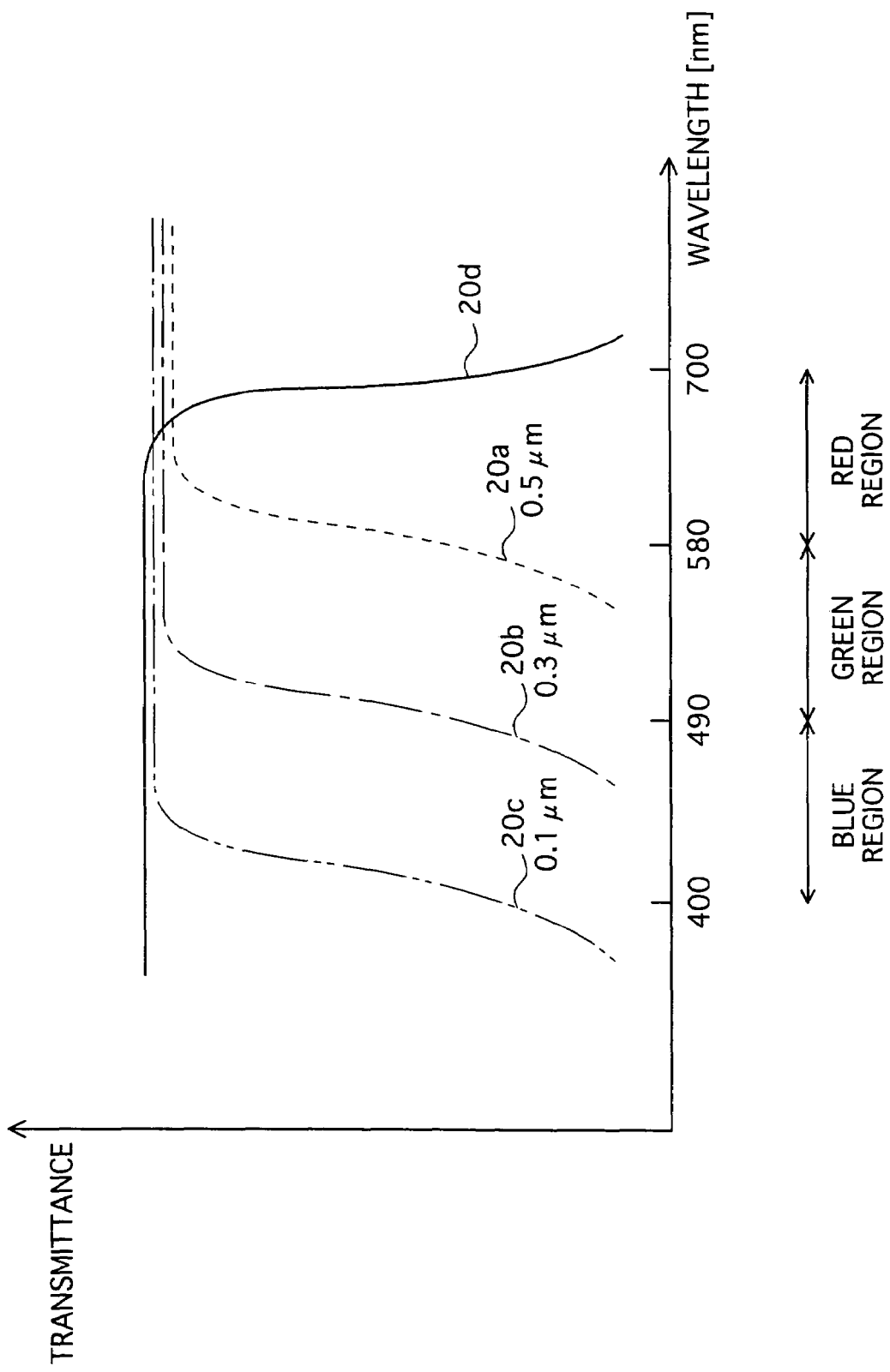
FIG. 3 is a graph showing light transmittance of polysilicon layers and an infrared cut filter.

FIG. 3 is a graph showing light transmittance of the polysilicon layers and the infrared cut filter.

A line 20a in the graph shows transmission characteristics of the polysilicon, when the thickness is 0.5 μm, through which the light having a wavelength of 580 nm or longer is transmitted.

A line 20b in the graph shows transmission characteristics of the polysilicon, when the thickness is 0.3 μm, through which the light having a wavelength of 490 nm or longer is transmitted.

A line 20c in the graph shows transmission characteristics of the polysilicon, when the thickness is 0.1 μm, through which the light having a wavelength of 400 nm or longer is transmitted.

In the first embodiment, the thicknesses of the filter layers are set as ta=0.5 μm, tb=0.3 μm, and tc=0.1 μm. However, actual numbers for ta, tb, and tc may be set in ranges of 0.01 μm to 2.0 μm, 0.01 μm to 1.5 μm, and 0 μm to 1.0 μm, respectively.

Making the thicknesses thinner has such an advantage that sensitivity is improved, and a disadvantage that color separation becomes difficult because differences among the thicknesses ta, tb, and tc becomes smaller and thus differences in transmission spectra also becomes smaller. On the other hand, while making the differences in spectroscopy larger decreases sensitivity, it has an advantage that the separation of colors becomes easier.

A line 20d in the graph shows transmission characteristics of the infrared cut filter, with which the light having a wavelength equal to or longer than 700 nm is cut.

By the above transmission characteristics, out of the incident light 22 to the photo-cell 1a, only the light in the red wavelength range passes through the filter layer 20 and reaches the photoelectric converter 17. Similarly, only the light in the red and green wavelength ranges out of the incident light 22 to the photo-cell 1b reaches the photoelectric converter 17. Also, the light in the red, green, and blue wavelength ranges reaches the photoelectric converter 17, out of the incident light 22 to the photo-cell 1c.

The incident light 22 that has been transmitted through the filter layer 20 further passes through the aperture 19.

The photo-shield 18 is disposed above the photoelectric converter 17, in order to prevent light scattered in adjacent photo-cells from coming in to the photoelectric converter 17. The aperture 19 is positioned immediately above the photoelectric converter 17. With such a construction, incident light that is substantially vertical to the substrate 11 reaches the photoelectric converter 17, and light at an angle to the substrate is blocked.

The photoelectric converter 17 is a photodiode formed by a pn junction with the P-type well 16, and generates a signal charge according to the intensity of the light that has reached the photoelectric converter 17 through the filter layer 20 and the aperture 19. The mechanism of the photoelectric conversion is as follows.

The photoelectric converter 17 has a depletion region in which carrier electrons are depleted after combined with electron holes that are carriers in the P-type well. With such a structure, a potential at the photoelectric converter 17 increases relatively to a potential at the P-type well 16, and accordingly, an internal electric field is generated in the depletion region.

When the incident light 22 reaches the photoelectric converter 17 in the above situation, electron hole pairs are generated by the photoelectric conversion, and the electrons and holes are drifted in opposite directions due to the internal electric field. Specifically, the electrons drift toward a center of the photoelectric converter 17, and the holes drift toward the P-type well. As a result, electrons are accumulated in the photoelectric converter 17 to form the signal charge in the photo-cell.

Thus, in the photo-cell 1a, the signal charge is formed according to the intensity of the light in the red wavelength range out of the incident light 22. Similarly, in the photo-cell 1b, the signal charge is formed according to the intensity of the light in the red and green wavelength ranges out of the incident light 22. In the photo-cell 1c, the signal charge is formed according to the intensity of the light in the red, green, and blue wavelength ranges out of the incident light 22.

According to the above structure, however, the signal charges formed in the photo-cells 1b and 1c each include more than one color signal. Therefore, in order to generate pieces of imaging data from the signal charges in the photo-cells, it is necessary to derive the color signals (R, G, B) by processing digital signals (Sa, Sb, Sc) that are based on the signal charges in the photo-cells (1a, 1b, 1c). The following explains a method of signal processing.

[Signal Processing]

Figure 4:
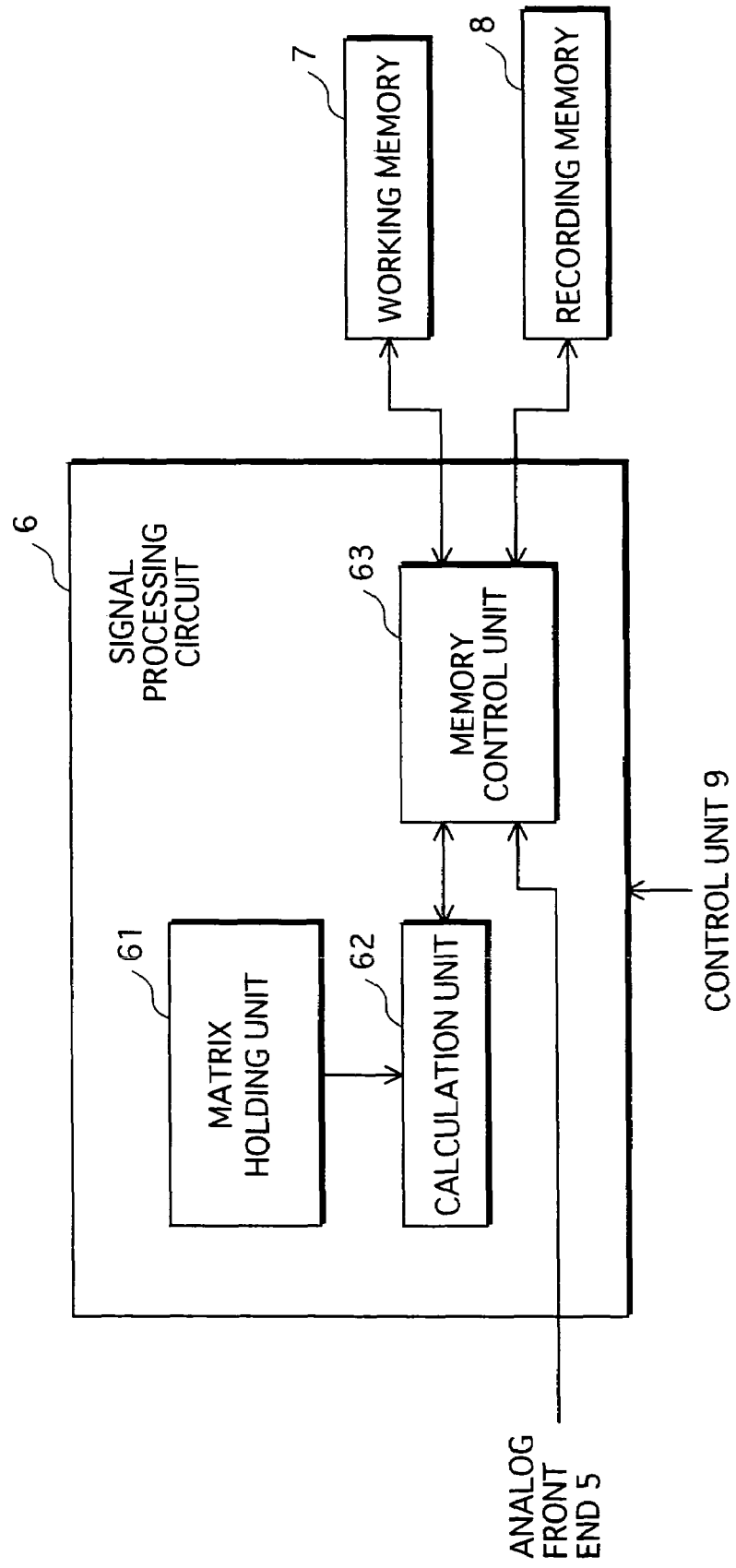
FIG. 4 is a diagram illustrating an internal structure of a signal processing circuit.

FIG. 4 is a diagram illustrating an internal structure of a signal processing circuit.

The signal processing circuit 6 includes a matrix holding unit 61, a calculation unit 62, and a memory control unit 63.

The matrix holding unit 61 holds a matrix for converting the digital signals (Sa, Sb, Sc) generated in the analog front end 5 into the color signals (R, G, B).

The calculation unit 62 obtains the color signals (R, G, B) by applying the matrix to the digital signals (Sa, Sb, Sc).

The memory control unit 63 controls an access to the working memory 7 and recording memory 8.

FIG. 5 shows the matrix and an inverse matrix held in the matrix holding unit 61.

The digital signals (Sa, Sb, Sc) and the color signals (R, G, B) are in a relation shown in FIG. 5A.

In the matrices, W11 and other coefficients indicate weighting factors based on properties of the filter layers 20. For example, when white light is entered into the photo-cell 1c, W11 is 0.333, W12 is 0.333, and W13 is 0.333, in a case in which all of the red light, green light, and blue light are passes through without being blocked. In a case in which the blue light is somewhat blocked, a correction may be made so as to set W11 becomes smaller. Further, in FIG. 5, the number in some terms of the matrix and the inverse matrix is 0. However, each term usually takes a number other than 0, in practice.

The matrix shown in FIG. 5B is the inverse matrix to the matrix that is held in the matrix holding unit 61. Therefore, the matrix is obtained by performing an inverse conversion to the matrix shown in FIG. 5A. The matrix shown in FIG. 5B is an inverse matrix of the matrix shown in FIG. 5A, which is the matrix held in the matrix holding unit 61.

[Operation of Memory Control Unit 63]

The memory control unit 63 temporary stores the digital signals from the analog front end 5 in the working memory 7. When the imaging data for one picture is stored in the working memory 7, the memory control unit 63 obtains a part of the imaging data from the working memory 7 and outputs the same to the calculation unit 62.

The calculation unit 62 applies the matrix held by the matrix holding unit 61 to the inputted data, and obtains the color signals (R, G, B).

The memory control unit 63 stores the color signals obtained by the calculation unit 62 in the recording memory 8, and build up the imaging data for one picture in the form of color signals.

By this, the imaging data for one picture is recorded in the recording memory 8.

[Method of Manufacturing]

Next, a method of manufacturing the filter layer 20 is explained below.

FIG. 6 illustrates an example of the method of manufacturing the filter layers 20.

Figure 6A:
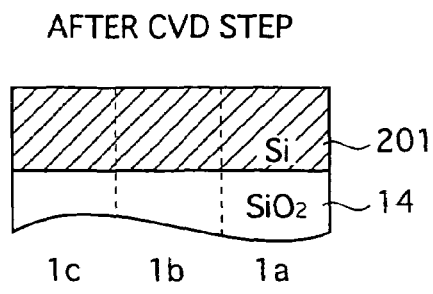
FIGS. 6A through 6H illustrate an example of a method of manufacturing a filter layer 20.

FIG. 6A shows the photo-cells after a chemical vapor deposition (CVD) step. In the CVD step, a polysilicon layer 201 is formed using the CVD, on an entire upper surface of a silicon oxide layer that has been formed in the photo-shield forming layer 14 of the photo-cells (1a, 1b, 1c). The polysilicon layer 201 is formed so as to be 0.5 μm in thickness.

Figure 6B:
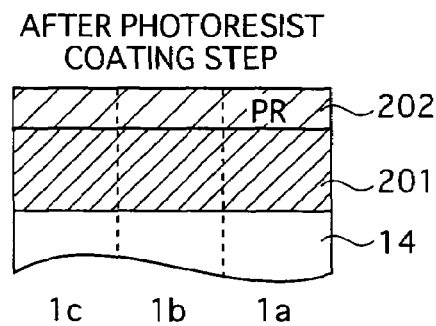

FIG. 6B shows the photo-cells after a photoresist coating step. In the photoresist coating step, a photoresist (PR) 202 is applied to an entire upper surface of the polysilicon layer 201 that has been formed in the CVD step.

Figure 6C:
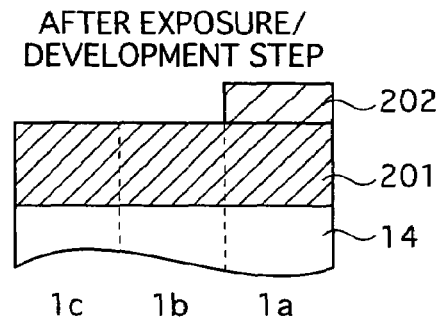

FIG. 6C shows the photo-cells after an exposure/development step. In the exposure/development step, the photoresist 202 formed in the photoresist step is exposed after masking in a predetermined pattern, and the exposed parts are removed and the rest of the parts are hardened. By this process, the photoresist 202 remains only at a part corresponding to the photo-cell 1a, where dry etching is not performed in a succeeding dry etching step.

Figure 6D:
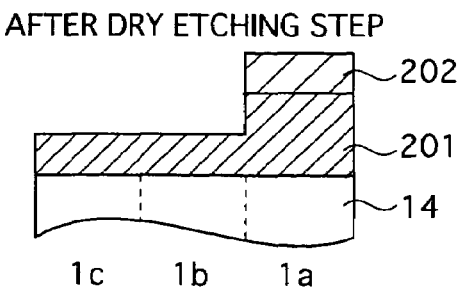

FIG. 6D shows the photo-cells after the dry etching step. In the dry etching step, the etching is performed to the polysilicon layer 201 after the exposure/development step. The parts of the polysilicon layer 201 where the photoresist 202 does not remain are etched so as to make the polysilicon layer 201 thinner. The polysilicon layer 201 is etched so that thickness at the parts corresponding to the photo-cells 1b and 1c becomes 0.3 μm.

It is possible to control the film thickness in the dry etching at an accuracy of ±30 nm, when the dry etching is perfomed to the polysilicon.

Figure 6E:
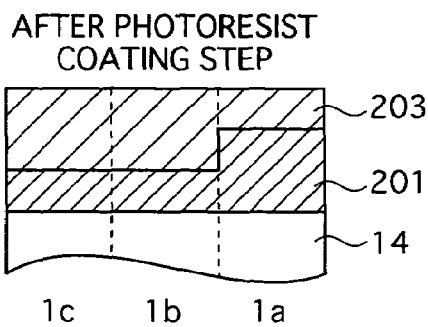

FIG. 6E shows the photo-cells after the photoresist coating step. In this step, a photoresist (PR) 203 is applied to an entire upper surface of the polysilicon layer 201 that has been, similarly to the step shown in FIG. 6B.

Figure 6F:
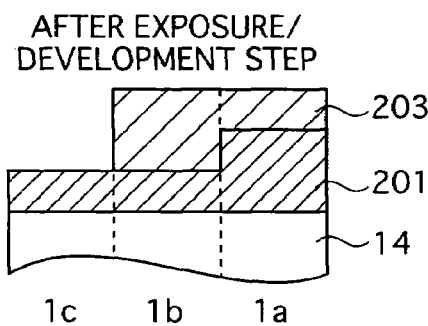

FIG. 6F shows the photo-cells after the exposure/development step. In this process, the photoresist 203 remains only at the parts corresponding to the photo-cells 1a and 1b, where dry etching is not performed in a succeeding dry etching step.

Figure 6G:
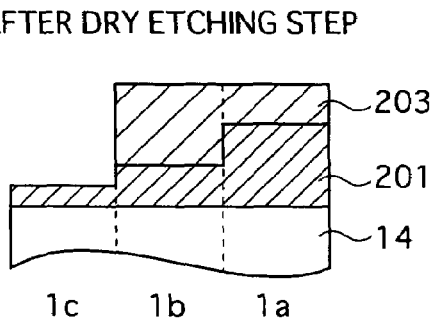

FIG. 6G shows the photo-cells after the dry etching step. In the dry etching step, the parts of the polysilicon layer 201 where the photoresist 203 does not remain are etched so as to make the polysilicon layer 201 thinner. The polysilicon layer 201 is etched so that thickness at the parts corresponding to the photo-cell 1c becomes 0.1 μm.

Figure 6H:
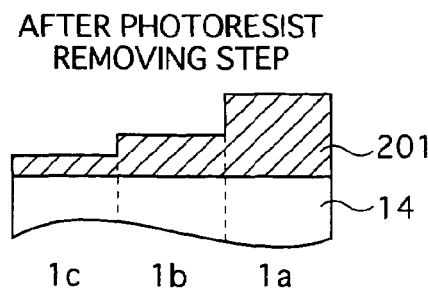

FIG. 6H shows the photo-cells after a photoresist removing step. In the photoresist removing step, the photo resist 203 that is no longer necessary is removed.

The polysilicon layers 201, formed through the above steps, serves as the filter layers 20 shown in FIG. 2.

As explained above, the wavelength ranges of light to be transmitted through the filter layers according to the first embodiment are determined based on the thicknesses of the filter layers, instead of pigments or dyestuff for different colors. Therefore, it is not necessary to control materials for the pigments or dyestuff for different colors in manufacturing process, and thus, it is possible to reduce production cost.

Further, the filter layers can be manufactured using a semiconductor fabrication technology, and a color filter manufacturing process that manages acrylic resins is not necessary. As a result, it is possible to utilize manufacturing facilities for semiconductor fabrication or to simplify the manufacturing process.

In order to reduce the light transmission, there are two possible methods. One is to have the filter layer absorb light, and the other is to have the filter layer reflect light. In the present invention, the former method is employed in view of material management and an incidence of flare phenomenon. Flare is such a phenomenon that a correct signal is overlapped with an incorrect signal by reflection light from neighboring photoelectric converters.

The latter method is realized, for example, by a multilayer structure with two materials having different refractive indexes disposed alternatingly. In the former method, as has been explained in the above, the filter layer is made of only one material (polysilicon, amorphous silicon, or silicon). Therefore, the former method is more advantageous than the latter method in terms of the material management.

In addition, in the latter method, light-that is not transmitted through the filter layer could reach neighboring photoelectric converters by scattering in the photodetector after being reflected by the filter layer. With the former method, light that is not transmitted through the filter layer is absorbed by the filter layer, and therefore the flare phenomenon does not occur very easily. Thus, the former method is more advantageous than the latter method in terms of the incidence of flare phenomenon.

In the first embodiment, a main surface of the filter layer 20 that faces toward alight source is covered by a film of silicon oxide that has smaller refractive index than the filter layer 20. Such a silicon oxide film reduces the refractive index of the incident light. Usually, the photodetectors are positioned in a gas such as air, and the light reaches the filter layer after passes through the gas. When the gas and the filter layer 20 have a direct connection, a difference between their refractive indexes becomes large, and thus reflectance at the boundary becomes high. In the first embodiment, therefore, by inserting the silicon oxide film between the gas and the filter layer 20 so as to reduce the reflectance, the sensitivity is improved.

Second Embodiment

[Outline]

In a second embodiment, the filter forming layer 15 is formed below the photo-shield forming layer 14, and the insulation layer 13 that insulates between the filter forming layer 15 and the photodiode layer 12 is formed so as to have a thickness in a range of 1 nm to 150 nm. With photo-cells having such a structure, reflections of the incident light 22 at boundaries between layers become smaller, and as a result, it is possible to suppress a decrease in sensitivity.

[Structure]

Figure 7:
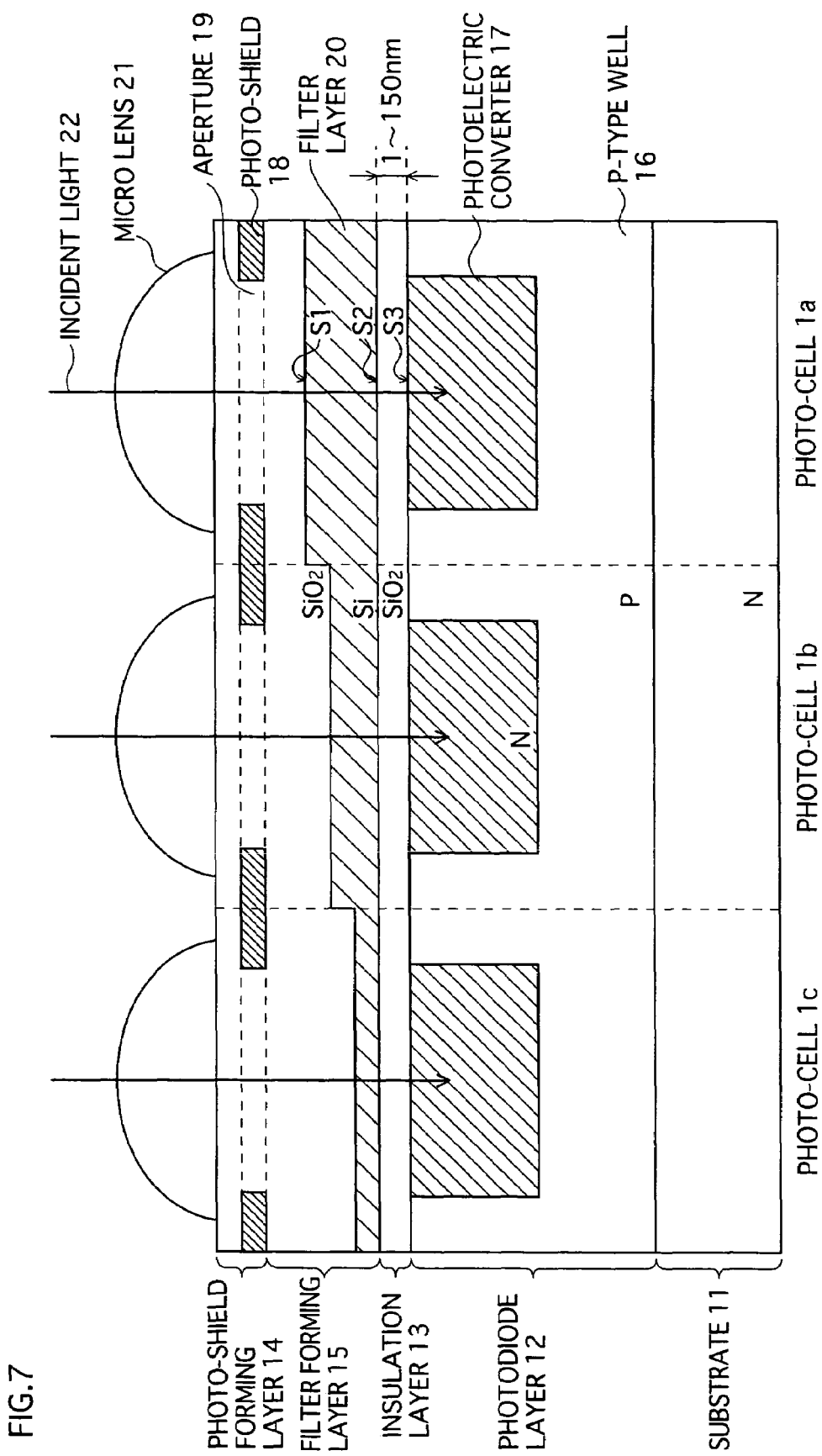
FIG. 7 is a sectional view of photo-cells (1a, 1b, 1c) according to a second embodiment.

FIG. 7 is a sectional view of photo-cells (1a, 1b, 1c) according to the second embodiment.

The photo-cells according to the second embodiment each include the substrate 11, the photodiode layer 12, the insulation layer 13, the photo-shield forming layer 14, and the filter forming layer 15. A difference from the photo-cells according to the first embodiment is that the filter forming layer 15 is formed between the photo-shield forming layer 14 and the insulation layer 13. Other than this difference, the photo-cells according to the second embodiment are the same as the photo-cells according to the first embodiment. Therefore, only the difference is explained below.

The filter forming layer 15 includes the filter layer 20 made of the polysilicon, and can be formed using a common semiconductor fabrication technology. Therefore, it is possible to form the filter forming layer 15 between the photodiode layer 12 and the photo-shield forming layer 14.

Because the filter layer 20 is made of polysilicon as explained above, signal charges generated in the photoelectric converter 17 may leak into the filter layer 20 if the filter layer 20 is not insulated from the photodiode layer 12. Therefore, the insulation layer 13 having a thickness in a range of 1 nm to 150 nm is disposed between the filter layer 20 and the photodiode layer 12.

The insulation layer 13 having a thickness in a range of 1 nm to 150 nm is a characteristic part of the photo-cells according to the second embodiment.

The incident light 22 is collected through the micro lens 21, and reaches the photoelectric converter 17 via the aperture 19 and the filter layer 20. Generally speaking, when light enters a medium having a high refractive index from another medium having a lower refractive index, the light reflects at a boundary of the two mediums at a certain rate.

Material and refractive indexes of layers in the photo-cell through which the incident light 22 passes are as follows.

Aperture 19: Made of silicon oxide and a refractive index is 1.45.

Filter layer 20: Made of polysilicon and a refractive index is 4.

Insulation Layer 13: Made of silicon oxide and a refractive index is 1.45.

Photoelectric converter 17: Made of N-type silicon and a refractive index is 4.

Specifically, the incident light 22 passes a boundary S1 which is an upper surface of the filter layer 20, a boundary S2 between the filter layer 20 and the insulation layer 13, a boundary S3 between the insulation layer 13 and the photoelectric converter 17, and the light reflects at a certain rate when passing through the S1 and S3. Therefore, an amount of light that reaches the photoelectric converter 17 decreases due to the reflection, and as a result, the sensitivity of the photo-cells decreases.

It has been known that the refractive index at the boundary between the insulation layer 13 and the photoelectric converter 17 can be reduced by setting the thickness of the insulation layer 13 in a range of 1 nm to 150 nm. By setting the thickness of the insulation layer 13 in a range of 1 nm to 150 nm, it is possible to suppress the decrease in the sensitivity of photo-cells.

As explained above, the photo-cells according to the second embodiment have an effect, in addition to the effects obtained with the photo-cells according to the first embodiment, to suppress the decrease in sensitivity of photo-cells by setting the thickness of the insulation layer 13 in a range of 1 nm to 150 nm and reducing the reflection of the incident light 22.

Third Embodiment

[Outline]

In a third embodiment, the insulation layer 13 between the filter layer 20 and the photodiode layer 12 is removed from the photo-cells in order to improve the sensitivity of the photo-cells. However, simply removing the insulation layer 13 causes another problem that the signal charge generated in the photoelectric converter 17 leak to the filter layer 20. Therefore, a potential barrier 23 is disposed between the photoelectric converter 17 and the filter layer 20 so as to prevent the signal charges from leaking. By this, it is possible to completely eliminate the reflection at the boundary between the insulation layer 13 and the photodiode layer 12.

[Structure]

Figure 8:
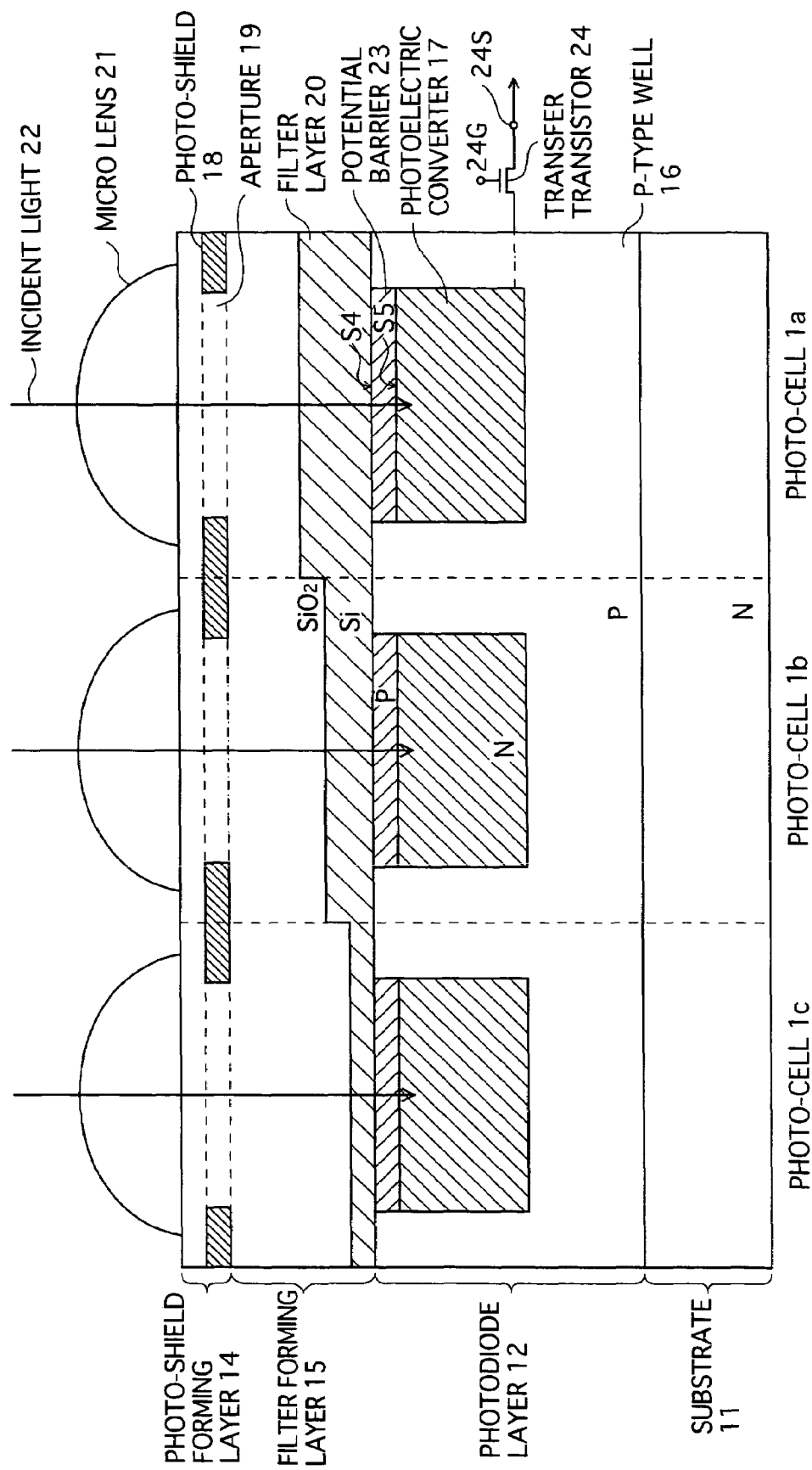
FIG. 8 is a sectional view of photo-cells (1a, 1b, 1e) according to a third embodiment.

FIG. 8 is a sectional view of photo-cells (1a, 1b, 1c) according to a third embodiment.

The photo-cells each include the substrate 11, the photodiode layer 12, the photo-shield forming layer 14, and the filter forming layer 15. A difference from the photo-cells according to the second embodiment is that the insulation layer 13 is not included. Other differences are that the potential barrier 23 is disposed between the photoelectric converter 17 and the filter layer 20, and that a transfer transistor 24, as shown in the drawing, for switching between transfer and non-transfer of the signal charges generated in the photoelectric converter 17 is provided to each of the photo-cells. Other than the above differences, the photo-cells are the same as the photo-cells in the second embodiment. Therefore, the following explains only the differences.

The potential barrier 23, at which a barrier potential is generated, is positioned between the photoelectric converter 17 and the filter layer 20, and formed by doping the photoelectric converter 17 with a P-type impurity. With the potential barrier 23, a leakage of the signal charges generated in the photoelectric converter 17 to the filter Layer 20 is prevented. Further, the potential barrier 23 is made of silicon as described above, and its refractive index is roughly the same as refractive indexes of the filter layer 20 and the photoelectric converter 17. Therefore, little reflection of the incident light 22 occurs at boundaries (S4, S5) between these layers.

In the transfer transistor 24, a drain electrode is connected to the photoelectric converter 17, a source electrode 24S is connected to the horizontal scan circuit 4, and a gate electrode 24G is connected to the vertical scan circuit 3. Therefore, it is possible to switch between transfer and non-transfer of the signal charges generated in the photoelectric converter 17, based on a control signal from the vertical scan circuit 3.

The transfer transistor 24 is provided to each of the photo-cells 1b and 1c as well, although not shown in the drawing. Further, the transfer transistors 24 are also provided to the photo-cells in other embodiments, but are not detailed because no special explanation is necessary for the transfer transistor 24 in other embodiments.

As described above, in the photo-cells, the barrier potential of the potential barrier 23 prevents the signal charges in the photoelectric converter 17 from leaking to the filter layers 20. Details of the barrier potential 23 are described below.

Figure 9A:
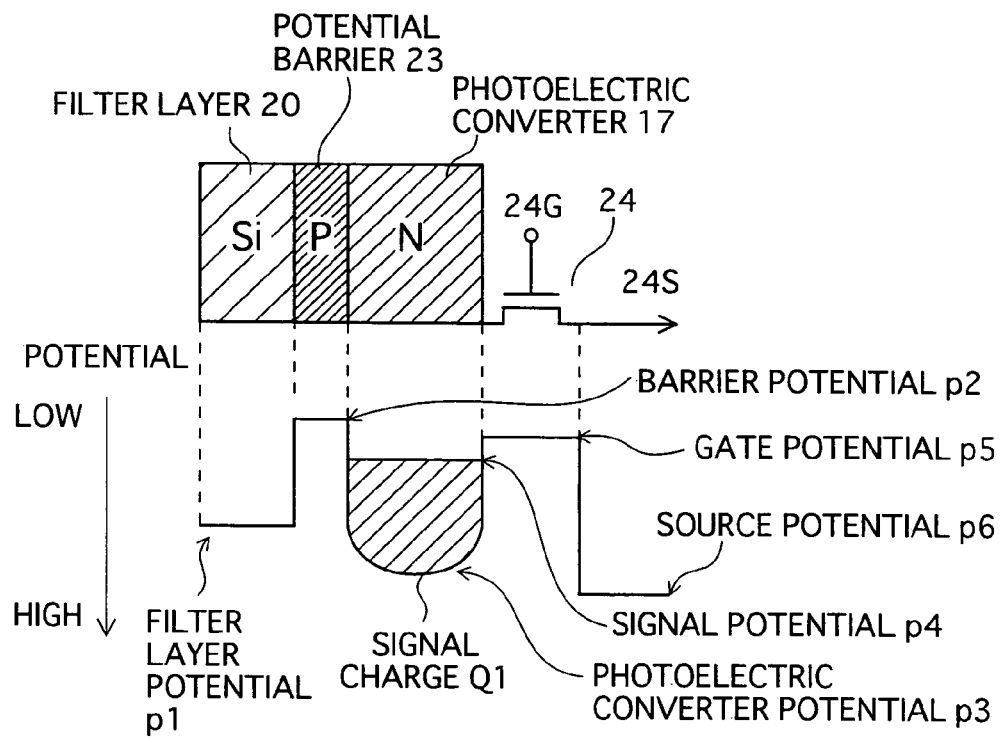
FIGS. 9A and 9B show potentials of the filter layer 20, a potential barrier 23, a photoelectric converter 17, and a transfer transistor 24 in the photo-cell.
Figure 9B:
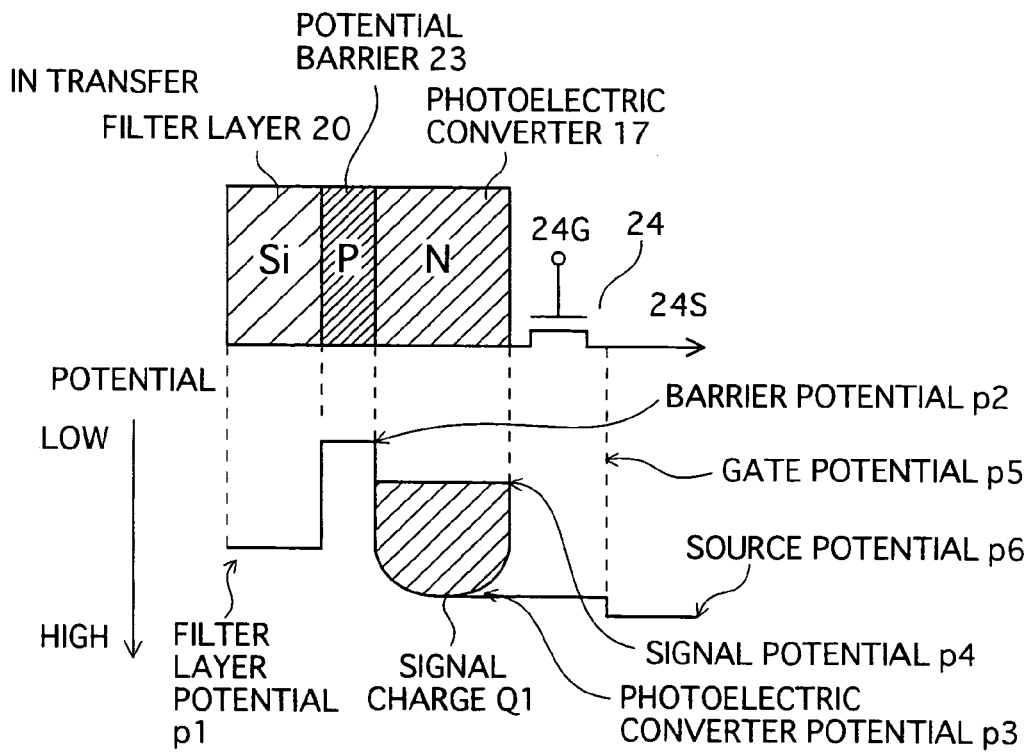

FIGS. 9A and 9B show potentials at the filter layer 20, the potential barrier 23, the photoelectric converter 17, and the transfer transistor 24 of the photo-cells 20.

FIG. 9A shows the potentials in a time of non-transfer.

The potential barrier 23 is a P-type semiconductor, and its potential (barrier potential p2) is relatively low, due to a pn junction with the photoelectric converter 17, than the potential of the photoelectric converter 17 (photoelectric converter potential p3), which is an N-type semiconductor. In the time of non-transfer, the vertical scan circuit 3 controls so that a gate potential p5 at a gate region of the transfer transistor 24 becomes low. Thus, a well potential is formed at the position of the photoelectric converter 17.

Electrons generated by the photoelectric conversion in the photoelectric converter 17 are accumulated in the well potential as a signal charge Q1, and a signal potential p4 declines as the signal charge Q1 is accumulated.

FIG. 9B shows the potentials in a time of transfer.

In the time of transfer, the vertical scan circuit 3 controls so that a gate potential p5 at a gate region of the transfer transistor 24 rises as high as the photoelectric converter potential p3. By controlling this way, the signal charge Q1 is transferred toward the source electrodes 24S.

As described above, the potential barrier 23 prevents the signal charge Q1 from leaking to the filter layer 20, by forming the barrier potential p2. In a case in which the potential barrier 23 is not provided, the signal charge Q1 may leak to the filter layer potential p1, when the signal potential p4 decreases down to the same potential as the filter layer potential p1.

The barrier potential p2 is a part that forms the well potential in the time of transfer, along with the gate potential p5, and thus it is desirable that the potential of the barrier potential p2 is set as high as the gate potential p5, or so that the barrier becomes higher (the potential becomes smaller) than the gate potential p5.

As explained above, the photo-cells according to the third embodiment achieves effects of eliminating a reflection at the boundary between the insulation layer 13 and the photodiode layer 12 almost completely and improves the sensitivity of the photo-cells, by removing the insulation layer 13 that insulates the filter layer 20 and the photodiode layer 12, in addition to the same effects as in the photo-cells according to the first embodiment.

Fourth Embodiment

[Outline]

The filter layers 20 according to a fourth embodiment are formed by doping the photoelectric converter 17 of the photodiode layer 12 with a P-type impurity at an upper part of the photoelectric converter 17. By such a forming method, it is possible to shorten the manufacturing process in comparison with the manufacturing process in which the polysilicon films having a predetermined thickness are formed using CVD and then etching is performed so as to make each of the films to have a predetermined thickness corresponding to each of the photo-cells.

[Structure]

Figure 10:
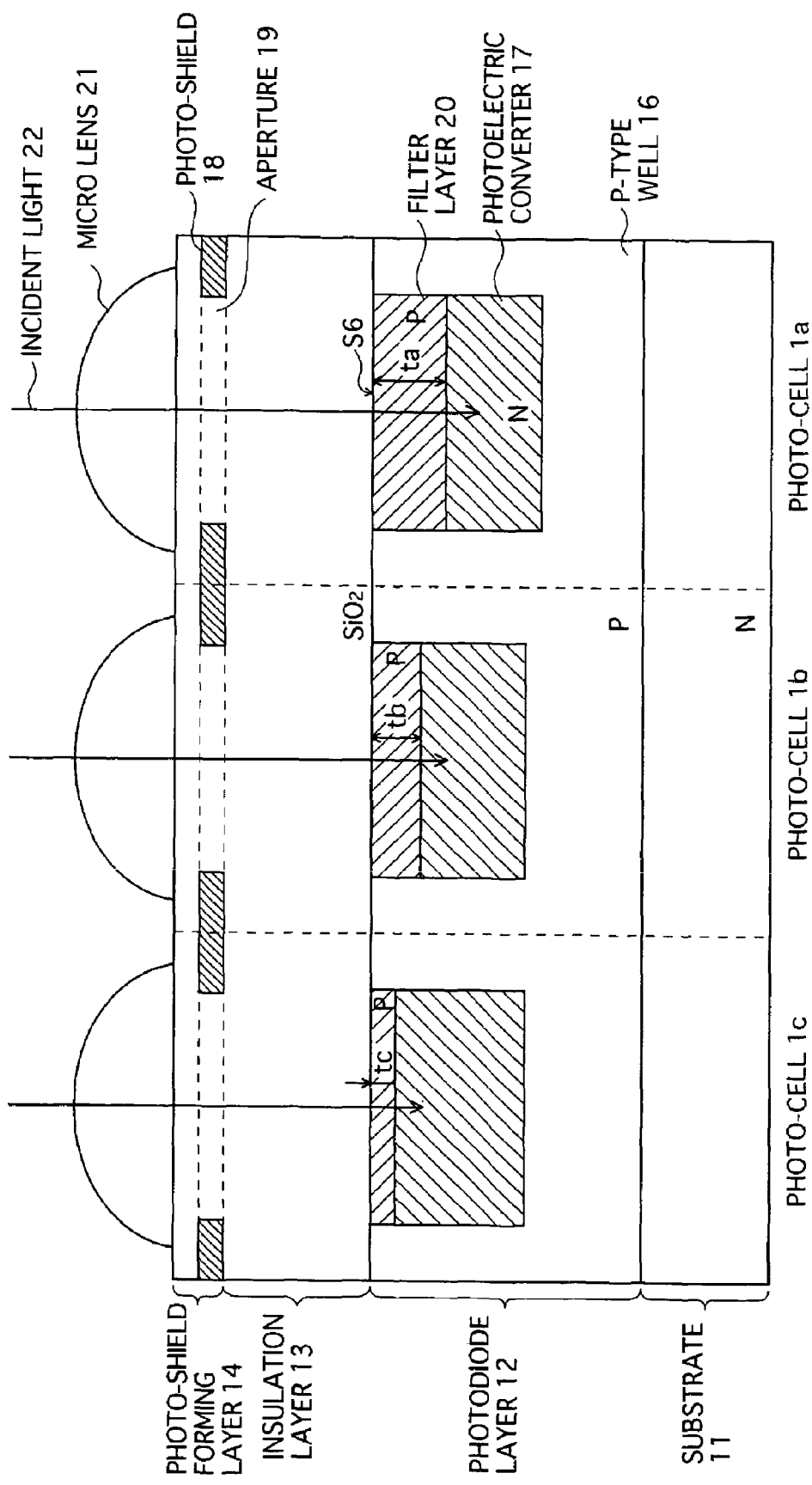
FIG. 10 is a sectional view of photo-cells (1a, 1b, 1c) according to a fourth embodiment.

FIG. 10 is a sectional view of photo-cells (1a, 1b, 1c) according to the fourth embodiment.

The photo-cells each include the substrate 11, the photodiode layer 12, the insulation layer 13, and the photo-shield forming layer 14. A difference from the photo-cells according to the first embodiment is that the filter layer 20 is formed on the photoelectric converter 17 of the photodiode layer 12. Other than that, the photo-cells according to the present embodiment is substantially the same as the photo-cells according to the first embodiment. The following describes only the part that is different from the first embodiment.

The filter layer 20 is formed by doping the photoelectric converter 17 with the P-type impurity. Thicknesses (ta, tb, tc) of the filter layers 20 of the photo-cells are set as follows, as in the first embodiment.

| | |
|---|---|
| ta: | 0.5 µm |
| tb: | 0.3 µm |
| tc: | 0.1 µm |

FIG. 11 shows relations between potentials and distances from a boundary S6 between the insulation layer 13 and the photodiode layer 12 in the photo-cells.

Figure 11A:
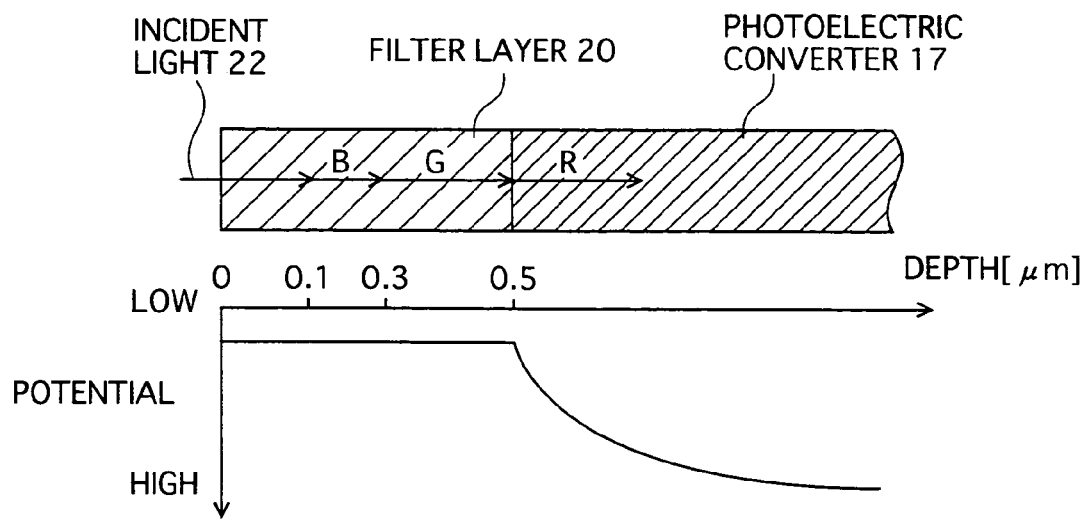
FIGS. 11A through 11C show a relation between a potential and a distance from a boundary between an insulation layer 13 and a photodiode layer 12 in the photo-cell.

FIG. 11A shows the photo-cell 1a.

The filter layer 20 of the photo-cell 1a is 0.5 µm in thickness, and only light having a wavelength of 580 nm or longer out of the incident light 22 (the light in the red wavelength range) passes though the filter layer 20 and reaches the photoelectric converter 17.

In the photoelectric converter 17, because of a potential gradient (an internal electric field), electrons generated by the photoelectric conversion drift toward a center of the photoelectric converter 17, and holes drift toward the filter layer 20. By this, electrons to be the signal charge are accumulated in the photoelectric converter 17.

At the same time, because the filter layer 20 is also made of silicon, electron hole pairs are generated due to the light in blue and green wavelength ranges out of the incident light 22. However, the electron hole pairs do not drift because the potential gradient is not formed in the filter layer 20 as shown in FIG. 11A. The electron hole pairs re-combine after a certain length of time, and then disappear.

Therefore, the signal charge in the photoelectric converter 17 of the photo-cell 1a is generated based only on the light in the red wavelength range.

Figure 11B:
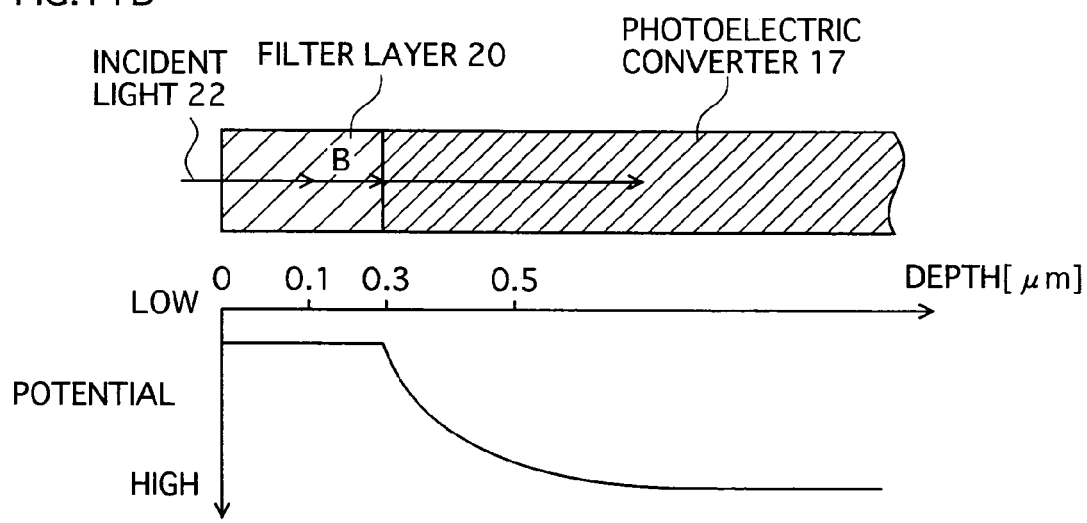

FIG. 11B shows the photo-cell 1b.

The filter layer 20 of the photo-cell 1b is 0.3 µm in thickness, and only light having a wavelength of 490 nm or longer out of the incident light 22 (the light in the red and green wavelength ranges) passes though the filter layer 20 and reaches the photoelectric converter 17.

Therefore, the signal charge in the photoelectric converter 17 of the photo-cell 1b is generated based on the light in the red and green wavelength ranges.

Figure 11C:
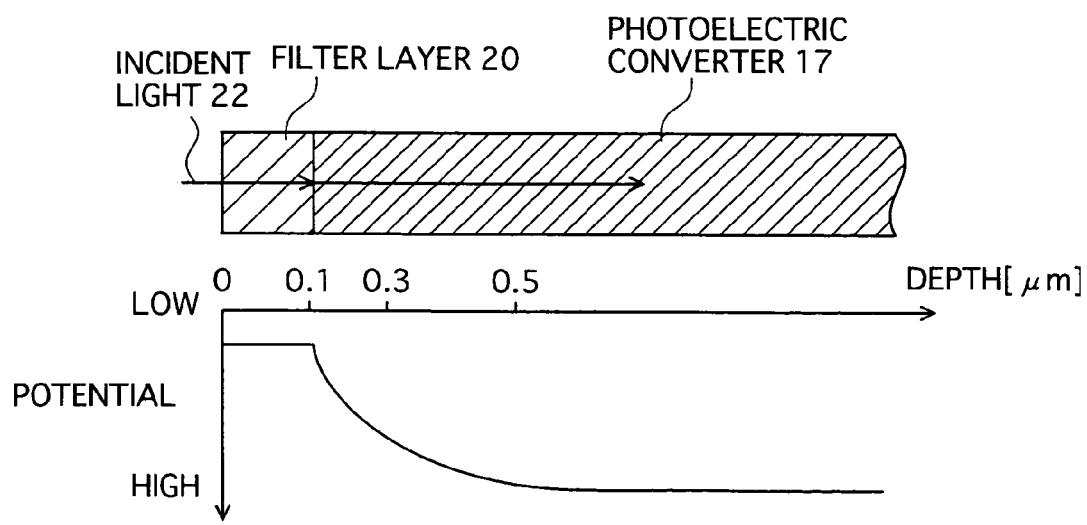

FIG. 11c shows the photo-cell 1c.

The filter layer 20 of the photo-cell 1c is 0.1 µm in thickness, and light having a wavelength of 400 nm or longer out of the incident light 22 (the light in the red, green and blue wavelength ranges) passes though the filter layer 20 and reaches the photoelectric converter 17.

Therefore, the signal charge in the photoelectric converter 17 of the photo-cell 1c is generated based on the light in the red, green, and blue wavelength ranges.

[Method of Manufacturing]

Next, a method of manufacturing the filter layer 20 according to the present embodiment is explained.

FIG. 12 illustrates an example of the method of manufacturing the filter layer 20.

The filter layer 20 is formed by an ion implantation of the P-type impurity after the photoelectric converter 17 is formed.

Figure 12A:
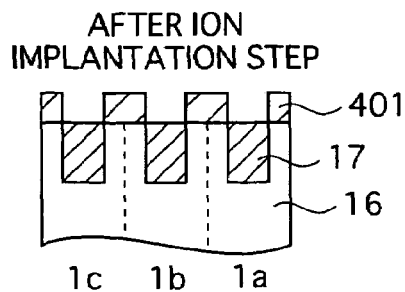
FIGS. 12A through 12G illustrate another example of a method of 15 manufacturing a filter layer 20.

FIG. 12A shows the photo-cells after an ion implantation step.

In the ion implantation step, the N-type impurity (such as phosphorus and arsenic) or the P-type impurity (such as boron) is ionized, accelerated by an electric field, and implanted to a silicon substrate and such. Areas where the ion implantation is not performed are protected covered by a photoresist 401.

In the example shown in the drawing, the photoelectric converter 17 is formed by doping the P-type well 16 with the N-type impurity.

Figure 12B:
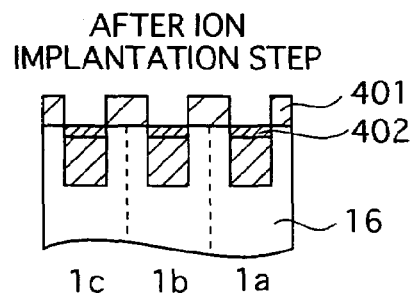

FIG. 12B shows the photo-cells after an ion implantation step.

In the ion implantation step, a P-type region 402 that is 0.1 µm in thickness is formed by the ion implantation of the P-type impurity to the photoelectric converter 17, utilizing the photoresist 401 used in forming the photoelectric converter 17. Thus, a filter layer for the photo-cell 1c is formed.

Accuracy in controlling film thickness in the ion implantation varies according to a type of ion to be implanted. When boron is selected as the P-type impurity, for example, it is possible to control at an accuracy of ±3 nm.

Figure 12C:
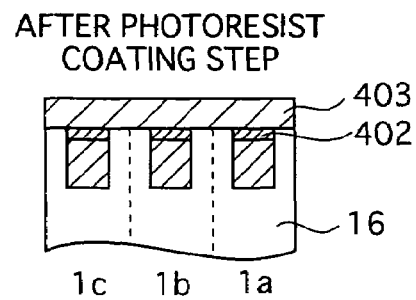

FIG. 12C shows the photo-cells after a photoresist coating step.

In the photoresist coating step, a photoresist 403 is applied to an entire upper part of the substrate.

Then, in an exposure/development step, the photoresist 403 that is applied to parts, where the ion implantation to be performed is removed.

Figure 12D:
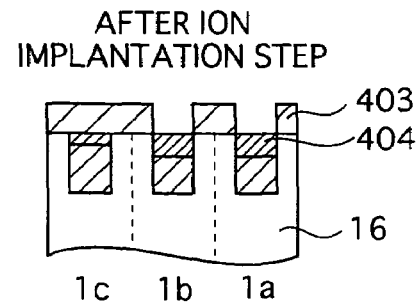

FIG. 12D shows the photo-cells after the ion implantation step.

By doping the photoelectric converter 17 with the P-type impurity, a P-type region 404 that is 0.3 µm in thickness is formed. Thus, a filter layer for the photo-cell 1b is formed. The photo-cell 1c is covered and protected by the photoresist, and therefore the ion implantation is not performed to the photo-cell 1c.

Figure 12E:
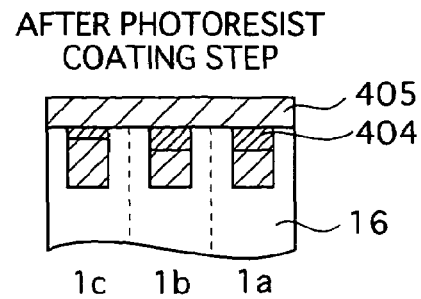

FIG. 12E shows the photo-cells after a photoresist coating step. In the photoresist coating step, a photoresist 405 is applied to an entire upper part of the substrate.

Then, in an exposure/development step, the photoresist 405 that is applied to parts, where the ion implantation to be performed is removed.

Figure 12F:
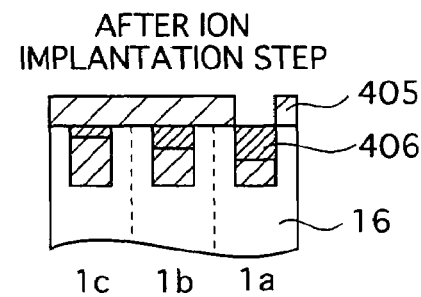

FIG. 12F shows the photo-cells after the ion implantation step.

By doping the photoelectric converter 17 with the P-type impurity, a P-type region 406 that is 0.5 µm in thickness is formed. Thus, a filter layer for the photo-cell 1a is formed. The photo-cells 1b and 1c are covered and protected by the photoresist, and therefore the ion implantation is not performed to the photo-cells 1b and 1c.

Figure 12G:
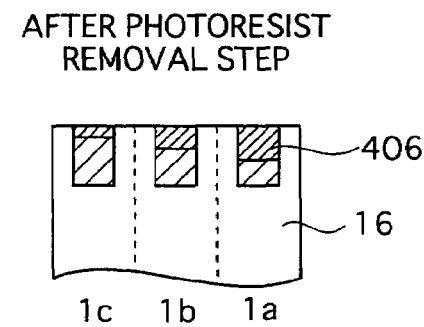

FIG. 12G shows the photo-cells after a photoresist removal step. In the photoresist removal step, the photoresist 405 is removed because it is not necessary any more. Thus, the filter layers 20 are formed.

As explained above, the photo-cells according to the third embodiment achieves an effect to shorten the manufacturing process to a large degree because the filter layers 20 are formed by utilizing the same photoresist that is used in forming the photoelectric converter 17, in addition to the effects achieved by the photo-cells according to the first embodiment.

Modified Examples

Although the camera system according to the present invention has been explained based on the preferred embodiments, the present invention is not limited to the above explained embodiments. Other possible forms of the present invention include modified examples as listed below.

(1) In the preferred embodiments, the explanations are give taking the MOS image sensor as an example. However, the present invention is also applicable to a CCD image sensor.

(2) The material for the filter layers 20 is not restricted to the polysilicon, and may be any material through which the light in different wavelength ranges passes according to the film thickness. For example, amorphous silicon may be used for the filter layers 20.

(3) The filter layers 20 are made only of polysilicon. However, the present invention is not restricted to this example, if each filter layer can absorb light of a wavelength longer than a predetermined wavelength more than light of a wavelength shorter than said wavelength. For example, the filter layers may be formed as a layered body of plural layers made of different materials.

(4) The filter layer 20 corresponding to the photo-cell 1c also has a function to cut the light in the ultraviolet region. Therefore, in a case in which a camera system includes other means for cutting the ultraviolet light, the filter layer 20 corresponding to the photo-cell 1c does not necessarily have to be provided. The incident light collected by a lens in a common camera system reaches the photodetector 1 after passing through an optical lowpass filter and an infrared cut filter. In such a camera system, if an ultraviolet cut filter is also provided, it is not necessary to cut the ultraviolet light at the photo-cell 1c in the photodetector 1.

Figure 13:
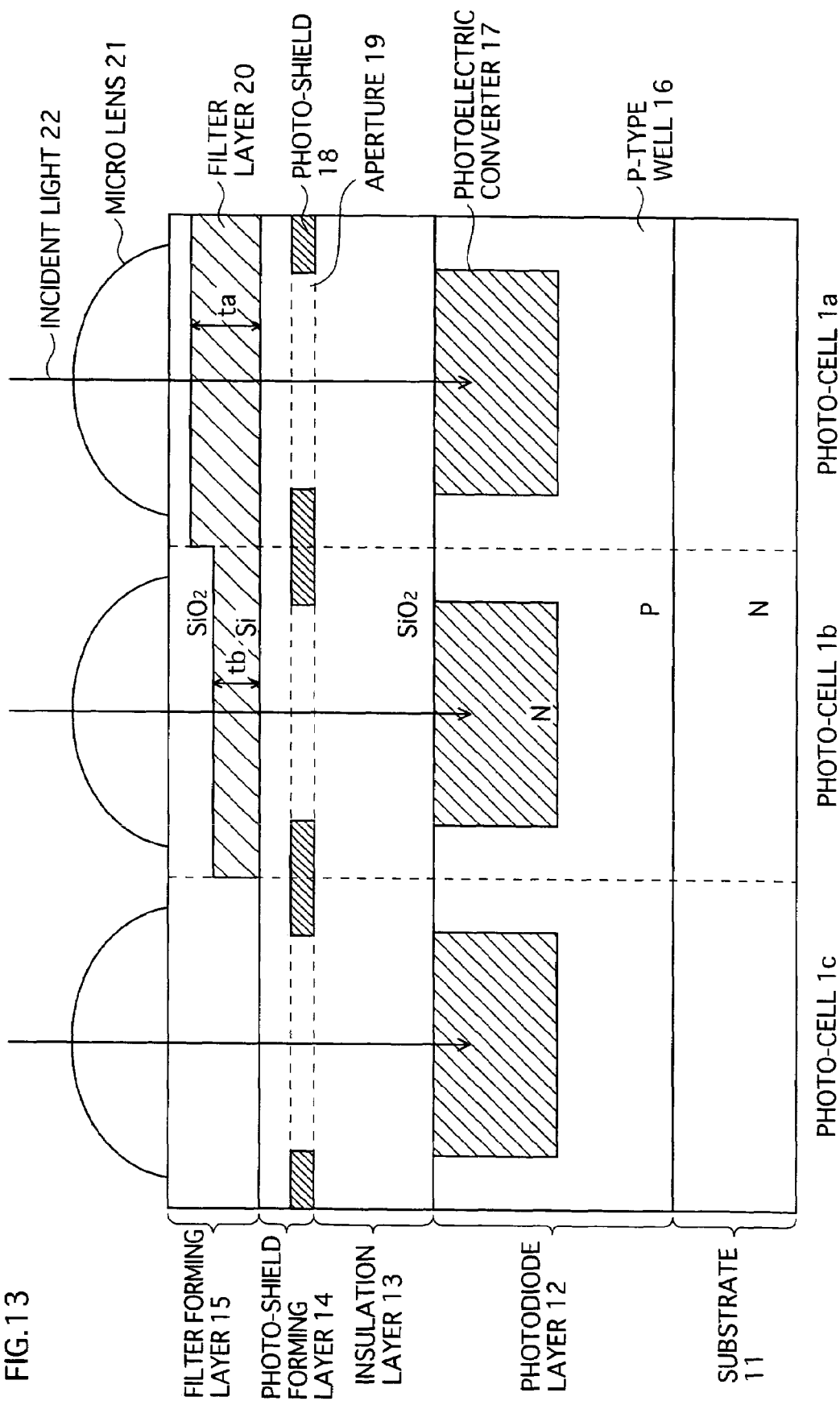
FIG. 13 is a sectional view of photo-cells (1a, 1b, 1e) according to a modified example.

FIG. 13 is a sectional view of photo-cells (1a, 1b, 1c) of an example in which the ultraviolet cut filter is provided to the camera system.

As shown in FIG. 13, the filter layer 20 corresponding to the photo-cell 1a is 0.5 μm in thickness, the filter layer 20 corresponding to the photo-cell 1b is 0.3 μm in thickness, and no filter layer is provided to a part corresponding to the photo-cell 1c.

(5) Through the first to third embodiments, the filter layers 20 are formed as one body over the photo-cells. Accordingly, it is also possible that, by forming the potential gradient in the filter layers 20 by setting one end of the filter layers 20 as one body to a ground potential (0 V) and the other end to a source potential (3V, for example), and electrons in electron hole pairs generated in the filter layers 20 are absorbed to the power source side and holes to the ground side when the incident light passes through the filter layers 20.

(6) In order to apply the present invention to a common digital still camera or a digital video camera, the thickness of the filter layers 20 in the photo-cells are set as ta =0.5 μm, tb =0.3 μm, and tc=0.1 μm. However, in a case in which the present invention is used for other purposes, the thickness is not limited to the above numbers.

(7) Strictly speaking, as shown in FIG. 3, a small amount of the light having a wavelength shorter than the cutoff wavelength 580 nm may pass through the filter layer that is 0.5 μm in thickness. Specifically, the light in the blue or green wavelength ranges passes through the filter layer for the photo-cell 1a to some degree, in addition to the light in the red wavelength range. A signal charge based on the light having a wavelength shorter than the cutoff wavelength is vanishingly small, however, and does not contribute much in forming a signal charge. Therefore, in order to simplify explanations, the present specification describes that only the light in the red wavelength range passes the filter layer of the photo-cell 1a. Similarly, a small amount of the light having a wavelength shorter than the cutoff wavelength that passes through the filter layers of the photo-cells 1b and 1c is not taken into account in the description.

Because of the above reason, the matrix and the inverse matrix shown in the embodiments include terms that take 0. However, each term may take a number other than 0 if the transmission of light having a wavelength shorter than the cutoff wavelength is taken into account.

(8) In the embodiments, the filter layers 20 are formed as one body over the photo-cells 1a, 1b, and 1c. However, the filter layers 20 may also be formed individually.

(9) In the embodiments, silicon oxide is used as the material of the antireflection layer on the main surface of the filter layer 20 that faces toward the light source. However, the material of the antireflection layer is not limited to silicon oxide, if the refractive index of the material is smaller than that of the filter layer 20. For example, the antireflection layer may be made of silicon nitride or silicon oxynitride (SiON).

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A photodetector comprising a semiconductor substrate having a plurality of photo-cells, each photo-cell including:
    a filter layer that transmits light in a wavelength range predetermined for the photo-cell; and
    a photoelectric converter operable to generate a signal charge according to an intensity of the transmitted light, wherein
    a thickness of each filter layer corresponds to a wavelength range predetermined for each photo-cell,
    the substrate is made of silicon,
    the photoelectric converter is formed by doping the substrate with an N-type impurity, and
    the filter layer is formed by doping the photoelectric converter with a P-type impurity.

2. A photodetector according to claim 1, wherein
    the filter layer is made of a material whose transmittance of light having a wavelength shorter than a cutoff wavelength is lower than that of light having a wavelength equal to or longer than the cutoff wavelength, the cutoff wavelength being determined by a thickness of the material.

3. A photodetector according to claim 2, wherein
    the filter layer is made of a material whose transmittance is lowered by absorbing light.

4. A photodetector according to claim 2, wherein the filter layer is mainly composed of one of polysilicon, amorphous silicon, and silicon.

5. A photodetector according to claim 2, wherein the filter layer is made of a material whose cutoff wavelength becomes longer as the material becomes thicker.

6. A photodetector according to claim 2, wherein the thickness of each filter layer is one of a first thickness, a second thickness, and a third thickness,
a cutoff wavelength for the first thickness is between a red wavelength range and a green wavelength range,
a cutoff wavelength for the second thickness is between the green wavelength range and a blue wavelength range, and
a cutoff wavelength for the third thickness is between the blue wavelength range and an ultra-violet wavelength range.

7. A photodetector according to claim 1, wherein the filter layer is mainly composed of one of polysilicon, amorphous silicon, and silicon.

8. A photodetector according to claim 1, wherein the photo-cell further includes an antireflection layer made of a material whose refractive index is smaller than that of the filter layer, the antireflection layer being disposed on a main surface of the filter layer facing toward a light source.

9. A photodetector according to claim 8, wherein the filter layer is mainly composed of one of polysilicon, amorphous silicon, and silicon, and
the antireflection layer is composed of one of silicon nitride, silicon oxide, and silicon oxynitride.

10. A photodetector comprising a semiconductor substrate having a plurality of photo-cells, each photo-cell including:
a filter layer that transmits light in a wavelength range predetermined for the photo-cell;
a photoelectric converter operable to generate a signal charge according to an intensity of the transmitted light; and
a photo-shield forming layer having a photo-shield and an aperture at a part corresponding to the photoelectric converter, the photo-shield blocking light other than light passing through the aperture, wherein
a thickness of each filter layer corresponds to a wavelength range predetermined for each photo-cell, and
the filter layer is positioned between the photo-shield forming layer and the photoelectric converter.

11. A photodetector according to claim 10, wherein the photo-cell further includes a silicon oxide layer whose thickness is in a range of 1 nm to 150 nm, disposed between the filter layer and-the photoelectric converter.

12. A photodetector according to claim 10, wherein the photo-cell further comprises:
a gate electrode operable to, when the signal charge is not transferred, generate a gate potential at a gate region between the photoelectric converter and a transfer destination, the gate potential being lower than a potential at the photoelectric converter; and
a potential barrier, at which a barrier potential that is lower than the gate potential is generated, disposed between the filter layer and the photoelectric converter.

* * * * *